US012688895B2

(12) United States Patent
Sano

(10) Patent No.: US 12,688,895 B2
(45) Date of Patent: Jul. 21, 2026

(54) SEMICONDUCTOR MEMORY DEVICE, MEMORY SYSTEM, AND CONTROL METHOD

(71) Applicant: Kioxia Corporation, Tokyo (JP)

(72) Inventor: Hajime Sano, Tokyo (JP)

(73) Assignee: Kioxia Corporation, Tokyo (JP)

( * ) Notice: Subject to any disclaimer, the term of this patent is extended or adjusted under 35 U.S.C. 154(b) by 137 days.

(21) Appl. No.: 18/821,402

(22) Filed: Aug. 30, 2024

(65) Prior Publication Data

US 2025/0095756 A1      Mar. 20, 2025

(30) Foreign Application Priority Data

Sep. 15, 2023    (JP) ................................. 2023-150050

(51) Int. Cl.
*G11C 16/34*        (2006.01)
*G11C 16/10*        (2006.01)
*G11C 16/12*        (2006.01)

(52) U.S. Cl.
CPC ........ *G11C 16/3404* (2013.01); *G11C 16/102* (2013.01); *G11C 16/12* (2013.01)

(58) Field of Classification Search
CPC ..................................................... G11C 16/34
USPC ................................................. 365/185.24
See application file for complete search history.

(56) References Cited

U.S. PATENT DOCUMENTS

2005/0057995 A1* 3/2005 Mitani .................... G11C 11/56
                                                         365/222
2011/0002173 A1    1/2011 Nagamatsu et al.
2012/0008413 A1    1/2012 Jeong
2014/0078829 A1    3/2014 He et al.
(Continued)

FOREIGN PATENT DOCUMENTS

JP        2011-014205 A      1/2011
JP        2012-018744 A      1/2012
(Continued)

OTHER PUBLICATIONS

H.-N. Yoo et al., "First Demonstration of 1-bit Erase in Vertical NAND Flash Memory" 2022 Symposium on VLSI Technology & Circuits Digest of Technical Papers, 2022 IEEE Symposium on VLSI Technology and Circuits (VLSI Technology and Circuits), Honolulu, HI, USA, Jun. 12-17, 2022, pp. 304-305.*
(Continued)

*Primary Examiner* — Muna A Techane
(74) *Attorney, Agent, or Firm* — Kim & Stewart LLP

(57)                    ABSTRACT
A semiconductor memory device includes memory cell transistors and a control circuit. The control circuit is configured to set a threshold voltage of each memory cell transistor to be in one of voltage ranges to store multi-bit data in each memory cell transistor. The voltage ranges include a first range corresponding to a first multi-bit value, a second range lower than the first range and corresponding to a second multi-bit value, and a third range that is the lowest. When a target memory cell transistor in which data of the second multi-bit value is to be written currently stores
(Continued)

data of the first multi-bit value, the control circuit is configured to apply a first voltage to a gate of the target memory cell transistor, to shift the threshold voltage of the target memory cell transistor to be in the second range without dropping into the third range.

20 Claims, 17 Drawing Sheets

(56)  References Cited

U.S. PATENT DOCUMENTS

| 2014/0089764 | A1* | 3/2014 | Goldman | G11C 16/34 |
| | | | | 714/773 |
| 2018/0268908 | A1* | 9/2018 | Iwasaki | G11C 7/06 |
| 2019/0287621 | A1 | 9/2019 | Tran et al. | |

| 2022/0020440 | A1* | 1/2022 | Kimura | G11C 16/3436 |
| 2023/0034752 | A1 | 2/2023 | Ning et al. | |
| 2023/0253024 | A1 | 8/2023 | Dong et al. | |

FOREIGN PATENT DOCUMENTS

| JP | 2023-065351 A | 5/2023 |
| TW | 201415467 A | 4/2014 |

OTHER PUBLICATIONS

H.-N. Yoo et al., "First Demonstration of 1-bit Erase in Vertical NAND Flash Memory" 2022 Symposium on VLSI Technology & Circuits Digest of Technical Papers, 2022 IEEE Symposium on VLSI Technology and Circuits (VLSI Technology and Circuits), Honolulu, HI, USA, Jun. 12-17, 2022, pp. 304-305. DOI: 10.1109/VLSITechnologyandCir46769.2022.9830445.

* cited by examiner

(a) FIRST APPLICATION OF PROGRAM VOLTAGE (b) SECOND APPLICATION OF PROGRAM VOLTAGE (c) THIRD APPLICATION OF PROGRAM VOLTAGE (d) FOURTH APPLICATION OF PROGRAM VOLTAGE (a) FIRST APPLICATION OF ERASE VOLTAGE (b) SECOND APPLICATION OF ERASE VOLTAGE

| STATE AFTER WRITING / ORIGINAL STATE | CELL DATA "0,1" | "0,0" | "1,0" | "1,1" |
|---|---|---|---|---|
| CELL DATA "0,1" | NO OPERATION | ONLY ERASURE | ONLY ERASURE | ONLY ERASURE |
| "0,0" | ONLY PROGRAMMING | NO OPERATION | ONLY ERASURE | ONLY ERASURE |
| "1,0" | ONLY PROGRAMMING | ONLY PROGRAMMING | NO OPERATION | ONLY ERASURE |
| "1,1" | ONLY PROGRAMMING | ONLY PROGRAMMING | ONLY PROGRAMMING | NO OPERATION |

SEMICONDUCTOR MEMORY DEVICE, MEMORY SYSTEM, AND CONTROL METHOD

CROSS-REFERENCE TO RELATED APPLICATION

This application is based upon and claims the benefit of priority from Japanese Patent Application No. 2023-150050, filed Sep. 15, 2023, the entire contents of which are incorporated herein by reference.

FIELD

Embodiments described herein relate generally to a semiconductor memory device, a memory system, and a control method.

BACKGROUND

In recent years, semiconductor memory devices that include nonvolatile memories are widespread. A solid state drive (SSD) including a NAND flash memory is known as one of memory systems including such a semiconductor memory device.

A semiconductor memory device such as a NAND flash memory includes a plurality of memory cell transistors (may be referred to as memory cells). Data stored in the memory cell corresponds to the amount of charge stored in a charge storage layer of the memory cell. Before a program operation for storing the data in the memory cell, an erase operation of erasing the data stored in the memory cell is performed. In the semiconductor memory device, deterioration of the memory cell proceeds as erase operations and program operations are repeated for the memory cell.

A technique to alleviate deterioration of the memory cells is in demand.

BRIEF DESCRIPTION OF THE DRAWINGS

FIG. 1 is a block diagram showing a configuration example of a memory system including a semiconductor memory device according to an embodiment.

FIG. 2 is a block diagram showing a configuration example of the semiconductor memory device.

FIG. 14 is a block diagram showing a second example of a flow of a write process executed in the semiconductor memory device.

FIG. 16 is a diagram showing correspondence between a combination of an original state and a state after writing of a write target memory cell in the semiconductor memory device, and a write process.

DETAILED DESCRIPTION

Figure 3:
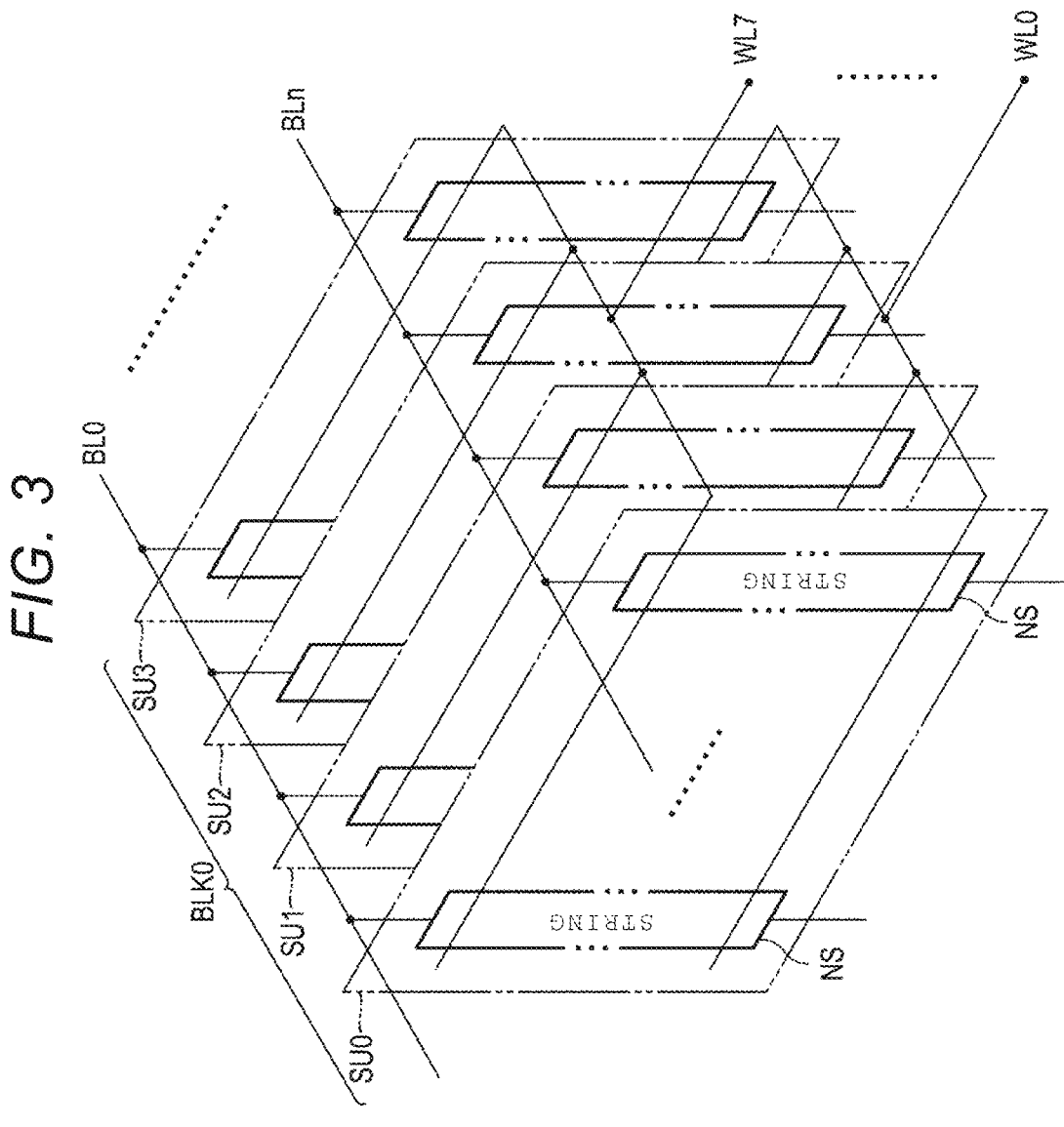
FIG. 3 is a diagram showing a configuration example of each of a plurality of blocks in a memory cell array of the semiconductor memory device.

Embodiments provide a semiconductor memory device, a memory system, and a control method that are capable of preventing memory cells from deteriorating. In general, according to an embodiment, a semiconductor memory device includes a plurality of memory cell transistors and a control circuit. The control circuit is configured to set a threshold voltage of each of the memory cell transistors to be in one of a plurality of voltage ranges separate from each other to store multi-bit data in each of the memory cell transistors, the plurality of voltage ranges including a first voltage range corresponding to a first multi-bit value, a second voltage range that is lower than the first voltage range and corresponds to a second multi-bit value, and a third voltage range that is the lowest in the plurality of voltage ranges and corresponds to an erased state. When a target memory cell transistor in which data of the second multi-bit value is to be written currently stores data of the first multi-bit value, the control circuit is configured to apply a first voltage to a gate of the target memory cell transistor, to shift the threshold voltage of the target memory cell transistor to be in the second voltage range without dropping into the third voltage range.

Hereinafter, one or more embodiments will be described with reference to the drawings.

In the following, it is assumed that a semiconductor memory device according to one or more embodiments is implemented as a NAND flash memory. Hereinafter, the NAND flash memory will be simply referred to as a NAND memory.

Figure 1:
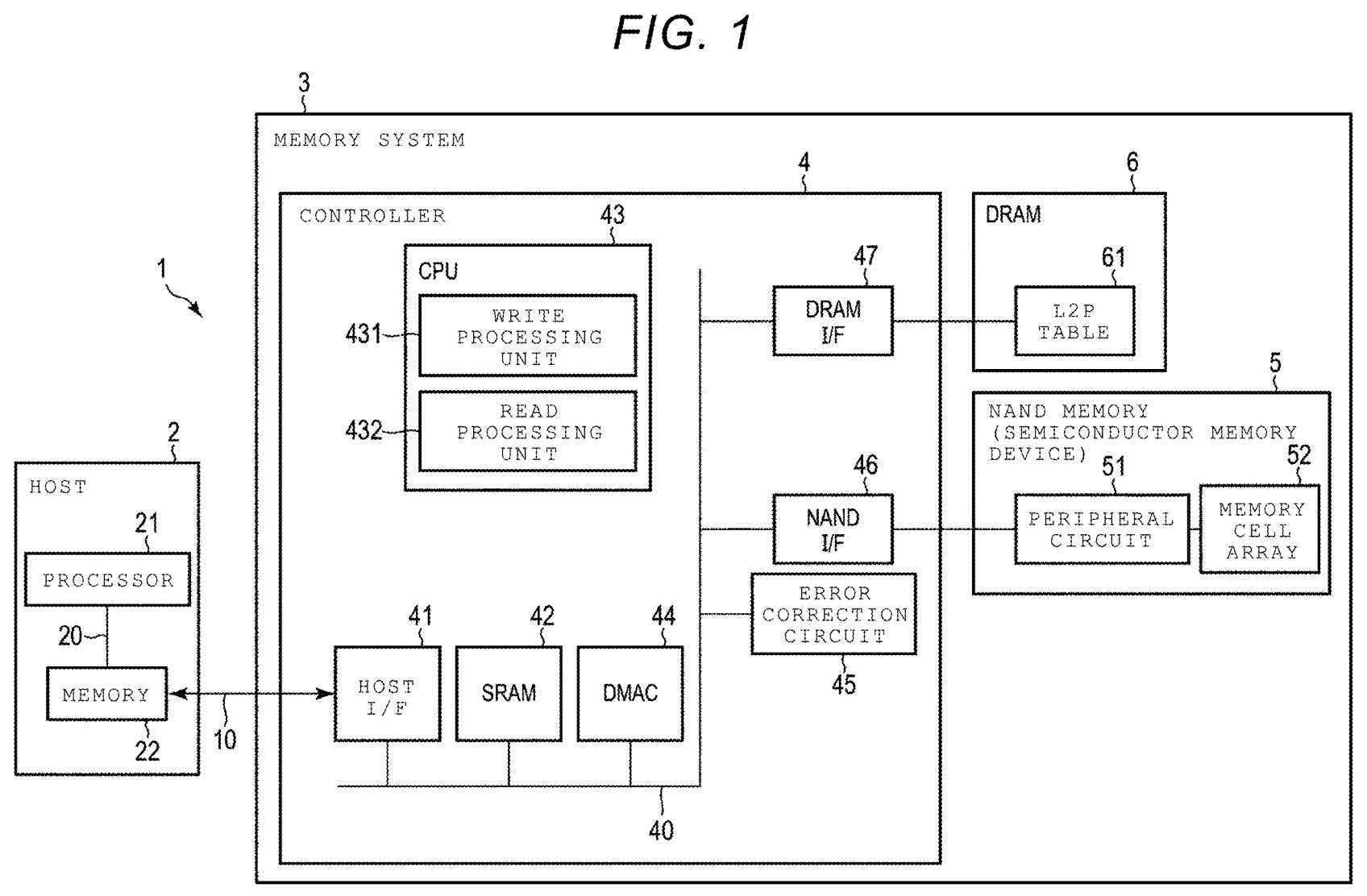

FIG. 1 is a block diagram showing a configuration example of a memory system 3 including the semiconductor memory device according to an embodiment. The memory system 3 is provided in an information processing system 1. The information processing system 1 further includes a host (host device) 2. The host 2 and the memory system 3 can be connected to each other via a bus 10.

The host 2 is an information processing device. The host 2 is, for example, a personal computer, a server computer, or a mobile device. The host 2 accesses the memory system 3. Specifically, the host 2 transmits an input/output (I/O) command to the memory system 3. The I/O command includes a command for writing data into a NAND memory 5 or reading data from the NAND memory 5. The I/O command is, for example, a write command or a read command.

The memory system 3 is a storage device that can be connected to the host 2. The memory system 3 is, for example, a solid state drive (SSD) or a universal flash storage (UFS) device. The memory system 3 includes the NAND memory 5 that is a semiconductor memory device.

The memory system 3 and the host 2 communicate with each other via the bus 10. The bus 10 is a communication path that connects the host 2 and the memory system 3. The bus 10 is, for example, a bus that complies with PCI express™ (PCIe™) standard or Mobile Industry Processor Interface™ (MIPI™) standard. The bus 10 is used for transmitting data and I/O commands from the host 2 to the memory system 3 and for transmitting data and responses from the memory system 3 to the host 2.

As a standard for a logical interface for connecting the host 2 and the memory system 3, for example, NVM express™ (NVMe™) standard may be used.

Next, a configuration of the host 2 will be described. The host 2 includes a processor 21 and a memory 22. The processor 21 and the memory 22 are interconnected via an internal bus 20.

The processor 21 is, for example, a central processing unit (CPU). The processor 21 executes software (host software) loaded into the memory 22 from the memory system 3 or another storage device connected to the host 2. The host software includes, for example, an operating system, a file system, and application programs.

The memory 22 is, for example, a volatile memory. The memory 22 is also referred to as a main memory, a system memory, or a host memory. The memory 22 is, for example, a dynamic random access memory (DRAM).

Next, a configuration of the memory system 3 will be described.

The memory system 3 includes a controller 4 and the NAND memory 5. The memory system 3 further includes a random access memory (RAM), for example, a DRAM 6. The DRAM 6 may be built into the controller 4.

The controller 4 is a circuit that functions as a memory controller. The controller 4 is, for example, a semiconductor device such as a system-on-a-chip (SoC). The controller 4 is electrically connected to the NAND memory 5. The controller 4 executes a write process and a read process based on each I/O command received from the host 2. The write process is a process for writing data to the NAND memory 5. The read process is a process for reading data from the NAND memory 5. In the write process, the controller 4 transmits a write request (may be referred to as a program request) to the NAND memory 5. In the read process, the controller 4 transmits a read request to the NAND memory 5. As a standard of an interface for electrically connecting the controller 4 and the NAND memory 5, for example, a Toggle interface or an open NAND flash interface (ONFI) is used. The function of each part of the controller 4 can be implemented by dedicated hardware, a processor that executes a program, or a combination of the dedicated hardware and the processor.

The NAND memory 5 is a semiconductor memory device. The NAND memory 5 writes data associated with a write request received from the controller 4 based on the write request. The NAND memory 5 reads data associated with a read request received from the controller 4 based on the read request.

The NAND memory 5 includes a plurality of blocks. Each of the plurality of blocks includes a plurality of pages. Each of the plurality of pages is a unit of each of a write operation (specifically, a program operation) and a read operation.

The DRAM 6 is a volatile memory. The DRAM 6 includes a storage area that stores, for example, a logical-to-physical address translation table (L2P table) 61.

The L2P table 61 is a table that stores mapping information. The mapping information is information that indicates correspondence between each logical address and each physical address of the NAND memory 5 in units of a particular management size. The logical address is an address used by the host 2 to access the memory system 3. For example, a logical block address (LBA) is used as the logical address. The physical address is an address indicating a storage location (physical storage location) in the NAND memory 5.

Next, an internal configuration of the controller 4 will be described. The controller 4 includes, for example, a host interface (host I/F) 41, a static RAM (SRAM) 42, a CPU 43, a direct memory access controller (DMAC) 44, an error correction circuit 45, a NAND interface (NAND I/F) 46, and a DRAM interface (DRAM I/F) 47. The host interface 41, the SRAM 42, the CPU 43, the DMAC 44, the error correction circuit 45, the NAND interface 46, and the DRAM interface 47 are interconnected via an internal bus 40. The controller 4 is configured as an electronic circuit including such elements.

The host interface 41 is an interface circuit for executing communication with the host 2. The host interface 41 executes, for example, a process of fetching each I/O command (write command, read command) from the memory 22 of the host 2, a process of acquiring write data associated with each fetched write command from the memory 22 of the host 2, a process of transferring data read from the NAND memory 5 based on each fetched read command to the memory 22 of the host 2, and a process of transmitting a completion response corresponding to each fetched I/O command to the host 2.

The SRAM 42 is a volatile memory. A storage area of the SRAM 42 is used, for example, as a work area of the CPU 43. A part of the storage area of the SRAM 42 may be used as a write buffer for temporarily storing write data received from the host 2. A part of the storage area of the DRAM 6 may be used as the write buffer.

The CPU 43 is a processor. The CPU 43 loads a control program (firmware) stored in the NAND memory 5 or a ROM (not shown) into the SRAM 42. The CPU 43 then performs various processes by executing the firmware. The firmware may be loaded into the DRAM 6.

The CPU 43 manages data stored in the NAND memory 5 and manages blocks in the NAND memory 5, for example, as a flash translation layer (FTL). The management of the data stored in the NAND memory 5 includes, for example, management of mapping information. For example, the CPU 43 manages mapping between each logical address and each physical address in units of a particular management size using the mapping information of the L2P table 61.

In the NAND memory 5, the controller 4 writes update data corresponding to a certain logical address to a different physical storage location, rather than to a physical storage location where previous data corresponding to the logical address is stored. Then, the controller 4 updates the L2P table 61 to associate the logical address with a physical address indicating the different physical storage location. The previous data is then treated as invalid data.

Among the blocks in the NAND memory 5, at least blocks including valid data are managed as active blocks. A block that does not include valid data and stores only invalid data is managed as a free block. The valid data means data stored in the physical storage location associated with the logical address in the L2P table 61 (that is, data associated with the logical address as the latest data). The valid data is likely to be read from the host 2 later. The invalid data means data that is not associated with any logical address. Data that is not associated with any logical address is data that can no longer be read from the host 2.

The DMAC 44 is a circuit for executing direct memory access (DMA). The DMAC 44 executes data transfer between the memory 22 of the host 2 and the SRAM 42 (or the DRAM 6).

The error correction circuit 45 executes an encoding process when data is written to the NAND memory 5. In the encoding process, the error correction circuit 45 adds an error correction code (ECC) to the data to be written to the NAND memory 5 as a redundant code. When data is read from the NAND memory 5, the error correction circuit 45 executes a decoding process. In the decoding process, the error correction circuit 45 executes error detection and error correction on the data using the ECC added to the data read from the NAND memory 5.

The NAND interface 46 is a memory interface circuit for controlling the NAND memory 5. The NAND interface 46 transmits the program request transmitted by the controller 4 for writing data to the NAND memory 5. The NAND interface 46 transmits the read request transmitted by the controller 4 for reading data to the NAND memory 5.

The DRAM interface 47 is a circuit for controlling the DRAM 6. The DRAM interface 47 stores data in the DRAM 6. The DRAM interface 47 reads data stored in the DRAM 6.

Next, an internal configuration of the NAND memory 5 will be described. The NAND memory 5 includes a peripheral circuit 51 and a memory cell array 52. The NAND memory 5 may include a memory cell array 52 with a two-dimensional structure, or may include a memory cell array 52 with a three-dimensional structure.

The peripheral circuit 51 is a circuit for controlling the memory cell array 52. The peripheral circuit 51 is also referred to as a control circuit. The peripheral circuit 51 executes an operation for writing data associated with a received program request to the memory cell array 52 in response to a reception of the program request from the NAND interface 46. For example, the peripheral circuit 51 executes at least one of a program operation, a read operation, and an erase operation to write data to the memory cell array 52. The peripheral circuit 51 executes an operation for reading data designated by a received read request from the memory cell array 52 in response to a reception of the read request from the NAND interface 46.

The memory cell array 52 includes a plurality of non-volatile memory cell transistors (hereinafter simply referred to as memory cells). Each of the plurality of memory cells is capable of having a certain threshold voltage and storing data corresponding to a threshold voltage range to which the threshold voltage belongs. The memory cell array 52 includes a plurality of blocks. Each block is a set of a plurality of memory cells. Each block includes a plurality of memory cell groups. The memory cell group is also referred to as a string unit. Each string unit is a set of memory cells. Each memory cell group includes a plurality of NAND strings (also simply referred to as strings). Each string is a set of memory cells connected in series.

The memory cell group may be used as a unit for a write operation and a read operation. For example, the program request includes information for designating a program target memory cell group. The peripheral circuit 51 executes a process of writing a part of data associated with the program request to each of the plurality of memory cells in the program target memory cell group. The read request includes information for designating a read target memory cell group. The peripheral circuit 51 executes processing for reading data from each of the plurality of memory cells in the read target memory cell group.

One memory cell can store at least one bit of data. For example, the memory cell array 52 may be used in a mode in which two or more bits of data are written for each memory cell. A mode in which two bits of data are written for each memory cell is referred to as a multi-level cell (MLC) mode. A mode in which three bits of data are written for each memory cell is referred to as a triple level cell (TLC) mode. A mode in which four bits of data are written for each memory cell is referred to as a quad level cell (QLC) mode. Alternatively, the memory cell array 52 may be used in a single level cell (SLC) mode in which one bit of data is written for each memory cell.

The larger the number of bits of data written for each memory cell, the more data can be stored even with the same hardware configuration, and thus the NAND memory 5 can be used more efficiently. However, the larger the number of bits of data written for each memory cell, the longer a time required to write the data, and thus the performance of the memory system 3 may be reduced.

The plurality of blocks in the memory cell array 52 may include blocks in which data is written in different modes. For example, some of the plurality of blocks may be blocks into which data is written in the SLC mode, and the other parts of the plurality of blocks may be blocks into which data is written in the QLC mode.

Next, a functional configuration of the CPU 43 will be described. The CPU 43 includes a write processing unit 431 and a read processing unit 432 in addition to elements functioning as an FTL. A part of or all of each of the write processing unit 431 and the read processing unit 432 may be implemented by dedicated hardware of the controller 4.

The write processing unit 431 executes a write process (may be referred to as a write operation) by processing each write command received from the host 2. The write process includes, for example, a process of acquiring write data associated with the write command from the memory 22 of the host 2, a process of writing the write data to a storage location in the NAND memory 5, and a process of updating the L2P table 61 to map (associate) a physical address indicating the storage location where the write data is written to a logical address designated by the write command. The write process also includes a process of transmitting a completion response indicating completion of processing of the write command to the host 2. The completion response indicating completion of the processing of the write command is transmitted to the host 2, for example, in response to the transfer of the write data associated with the write command from the memory 22 of the host 2 to the SRAM 42.

In the process of writing the write data to the storage location in the NAND memory 5, the NAND interface 46 transfers a program request and write data associated with the program request to the NAND memory 5 to instruct the NAND memory 5 to execute a program operation. The program request includes, for example, information for designating a storage area to which write data is to be written. The storage area designated by the program request corresponds to, for example, a memory cell group. The program operation is an operation of writing the write data transferred to the NAND memory 5 into the memory cells of the memory cell array 52. The program operation is executed by the peripheral circuit 51 that receives the program request.

The read processing unit 432 executes a read process by processing each read command received from the host 2. The read process includes a process of reading data corresponding to a logical address designated by the read command from the NAND memory 5, a process of transferring the read data to the memory 22 of the host 2, and a process of transmitting a completion response indicating completion of processing of the read command to the host 2. In the process of reading the data from the NAND memory 5, the read processing unit 432 specifically converts a logical address designated by the read command into a physical address by referring to the L2P table 61, and reads the data from a storage location in the NAND memory 5 indicated by the physical address.

In the process of reading the data from the storage location of the read target NAND memory 5, the NAND interface 46 instructs the peripheral circuit 51 to execute a read operation (also referred to as a sensing operation) by transmitting a read request to the NAND memory 5. The read operation is an operation of reading data from the memory cell array 52. The read operation is executed by the peripheral circuit 51. Then, the NAND interface 46 executes a data output operation for transferring the read data from the NAND memory 5 to the controller 4.

Figure 2:
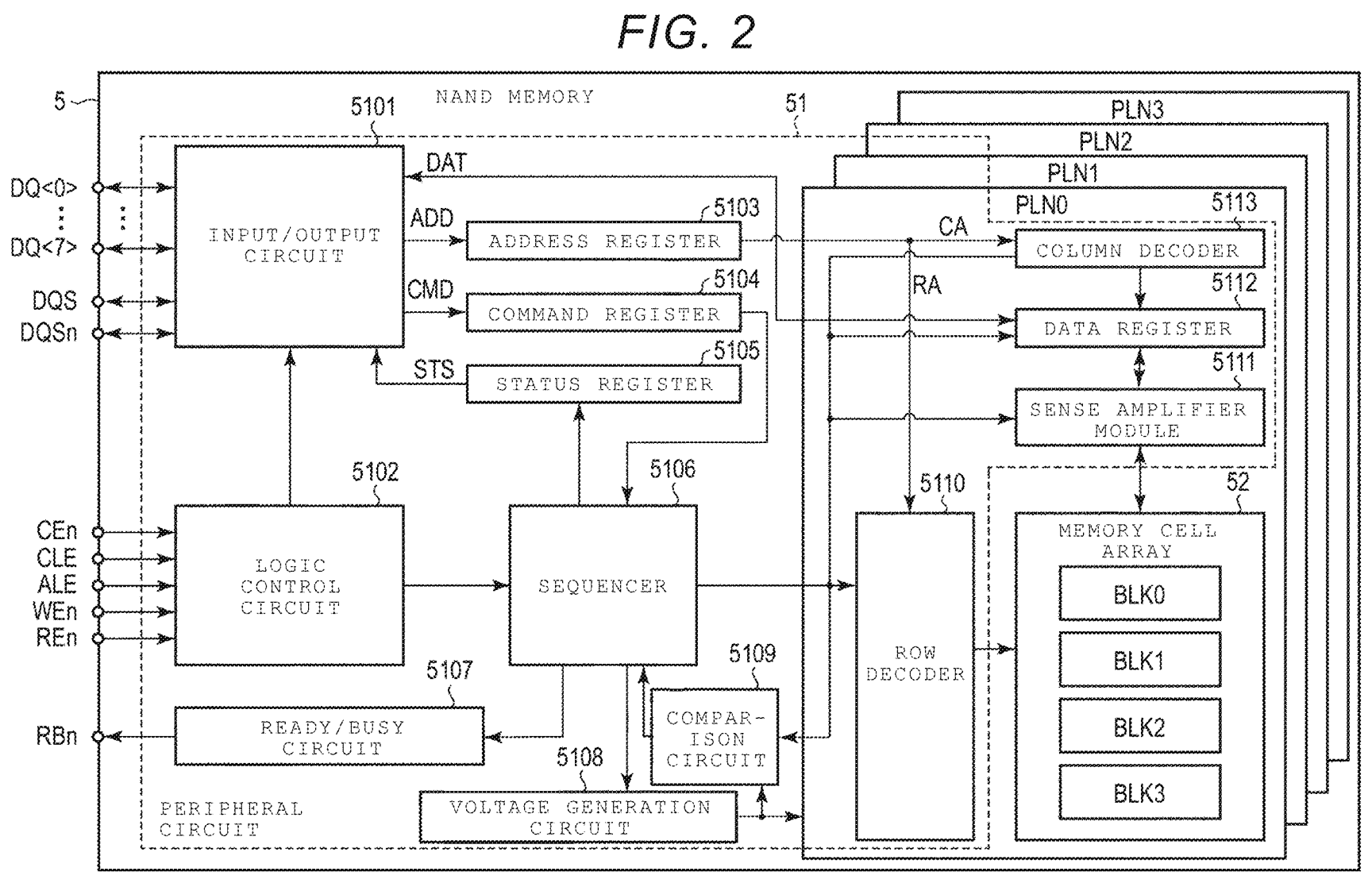

Next, an example of the internal configuration of the NAND memory 5 will be described. FIG. 2 is a block diagram showing a configuration example of the NAND memory 5 according to the embodiment. In the example shown in FIG. 2, some of connections between elements are indicated by arrow lines. However, the connections between the elements are not limited thereto.

The NAND memory 5 is connected to the controller 4. The NAND memory 5 operates based on instructions given from the controller 4.

The NAND memory 5 includes the peripheral circuit 51 and the memory cell array 52. The NAND memory 5 includes a plurality of planes PLN. The peripheral circuit 51 includes an input/output circuit 5101, a logic control circuit 5102, an address register 5103, a command register 5104, a status register 5105, a sequencer 5106, a ready/busy circuit 5107, a voltage generation circuit 5108, a comparison circuit 5109, a row decoder 5110, a sense amplifier module 5111, a data register 5112, and a column decoder 5113. Each of the elements of the peripheral circuit 51 may be implemented by dedicated hardware, or may be implemented by the functions of the peripheral circuit 51. The memory cell array 52 is provided in each of the plurality of planes PLN. Some of the elements of the peripheral circuit 51 may be provided in each of the plurality of planes PLN. In FIG. 2, the row decoder 5110, the sense amplifier module 5111, the data register 5112, and the column decoder 5113 are provided in each of the plurality of planes PLN (PLN0 to PLN3).

The input/output circuit 5101 is a circuit for inputting and outputting a signal DQ. The input/output circuit 5101 is connected to the controller 4. The input/output circuit 5101 is connected to the address register 5103, the command register 5104, the status register 5105, and the data register 5112 of each plane PLN. The signal DO is, for example, an 8-bit signal DQ<7:0>. The signal DQ<7:0> includes, for example, data DAT, an address ADD, and a command CMD. When the input signal DO is the data DAT (for example, data to be written to the memory cell array 52), the input/output circuit 5101 receives the input signal DQ based on strobe signals DQS and DQSn. The input/output circuit 5101 then transmits the data DAT to the data register 5112 of the corresponding plane PLN. The input/output circuit 5101 outputs the data DAT (for example, data read from the memory cell array 52) and status information STS to the controller 4 along with the strobe signals DQS and DQSn. When the input signal DQ is the address ADD (for example, a physical address), the input/output circuit 5101 transmits the address ADD to the address register 5103. When the input signal DQ is the command CMD (for example, a program request or a read request), the input/output circuit 5101 transmits the command CMD to the command register 5104.

The logic control circuit 5102 is a circuit for performing logic control based on a control signal. The logic control circuit 5102 is connected to the controller 4. The logic control circuit 5102 is connected to the input/output circuit 5101 and the sequencer 5106. The logic control circuit 5102 receives various control signals from the controller 4. The logic control circuit 5102 controls the input/output circuit 5101 and the sequencer 5106 based on the received control signals.

The address register 5103 is a register that temporarily stores the address ADD received from the input/output circuit 5101. The address register 5103 is connected to the row decoder 5110 and the column decoder 5113 of each plane PLN. The address ADD includes a row address RA and a column address CA. The address register 5103 transmits the row address RA to the row decoder 5110. The address register 5103 transmits the column address CA to the column decoder 5113.

The command register 5104 is a register that temporarily stores the command CMD received from the input/output circuit 5101. The command register 5104 is connected to the sequencer 5106. The command register 5104 transmits the command CMD to the sequencer 5106.

The status register 5105 is a register that temporarily stores the status information STS. The status register 5105 is connected to the sequencer 5106. The status register 5105 temporarily stores the status information STS in a program operation, a read operation, an erase operation, and the like. The status information STS is transmitted to the controller 4 via the input/output circuit 5101.

The sequencer 5106 controls the operation of the entire NAND memory 5. More specifically, the sequencer 5106 controls the ready/busy circuit 5107, the voltage generation circuit 5108, the row decoder 5110, the sense amplifier module 5111, the data register 5112, the column decoder 5113, and the like. The sequencer 5106 executes a program operation, a read operation, and an erase operation based on the command CMD stored in the command register 5104.

Here, the sequencer 5106 controls the voltage generation circuit 5108 to generate voltages used for performing various operations. The sequencer 5106 can execute a program operation, a read operation, and an erase operation based on a comparison result received from the comparison circuit 5109. The sequencer 5106 transmits the status information STS to the status register 5105.

For example, the sequencer 5106 executes a read operation on the program target memory cell group based on a program request. The sequencer 5106 determines whether to execute a program operation and whether to execute an erase operation with respect to a write target memory cell among the plurality of memory cells in the program target memory cell group based on a threshold voltage of the write target memory cell and a threshold voltage corresponding to data to be stored in the write target memory cell. The sequencer 5106 executes a read operation for a read target memory cell group based on a read request.

The ready/busy circuit 5107 is a circuit for transmitting a ready/busy signal RBn. The ready/busy circuit 5107 transmits the ready/busy signal RBn to the controller 4 according to an operating status of the sequencer 5106.

The voltage generation circuit 5108 generates voltages used to control the NAND memory 5. The voltage generation circuit 5108 generates voltages, for example, under the control of the sequencer 5106. The voltage generation circuit 5108 supplies the generated voltages to the comparison circuit 5109, the memory cell array 52, the row decoder 5110, the data register 5112, the column decoder 5113 of each plane PLN, and the like. The voltages generated by the voltage generation circuit 5108 include a program voltage Vpg, a read voltage Vrv, an erase voltage Ver, and a target threshold voltage Vref. The program voltage Vpg is a voltage to be applied to a word line (i.e., the gate) of a program target memory cell group during a program operation. The read voltage Vrv is a voltage to be applied to a word line (i.e., the gate) of the read target memory cell group during a read operation. The erase voltage Ver is a voltage to be applied to a word line (i.e., the gate) of an erase target memory cell during an erase operation. The target threshold voltage Vref is a voltage used by the comparison circuit 5109. The target threshold voltage Vref is a voltage determined based on data to be written to the write target memory cell. Under the control of the sequencer 5106, the voltage generation circuit 5108 generates a first voltage Vref max that is an upper limit of a target threshold voltage range determined based on the data to be written to the write target memory cell, and a second voltage Vref min that is a lower limit of the target threshold voltage range, as the target threshold voltages Vref. Alternatively, the voltage generation circuit 5108 generates one voltage (third voltage Vref) determined based on the data to be written to the write target memory cell as the target threshold voltage Vref under the control of the sequencer 5106. The third voltage Vref is, for example, a median value of the target threshold voltage range determined based on the data to be written to the write target memory cell.

The comparison circuit 5109 compares a magnitude relationship between the threshold voltage of the write target memory cell in the memory cell array 52 and the target threshold voltage generated by the voltage generation circuit 5108. Then, the comparison circuit 5109 outputs a comparison result to the sequencer 5106.

For example, when the target threshold voltage includes the first voltage Vref max and the second voltage Vref min, the comparison circuit 5109 outputs, to the sequencer 5106, a comparison result indicating any one of that the threshold voltage of the write target memory cell is higher than the first voltage Vref max, that the threshold voltage of the write target memory cell is equal to or lower than the first voltage Vref max and equal to or higher than the second voltage Vref min, or that the threshold voltage of the write target memory cell is lower than the second voltage Vref min.

For example, when the target threshold voltage is the third voltage Vref, the comparison circuit 5109 outputs, to the sequencer 5106, a comparison result indicating any one of that the threshold voltage of the write target memory cell is higher than the third voltage Vref and that the threshold voltage of the write target memory cell is equal to or lower than the third voltage Vref. However, instead of determining whether the threshold voltage of the write target memory cell is equal to or lower than the third voltage Vref, the comparison circuit 5109 may determine whether the threshold voltage of the write target memory cell is equal to or higher than the third voltage Vref.

The plane PLN is a unit of a data write operation and a data read operation. In the example of FIG. 2, the NAND memory 5 includes four planes PLN0, PLN1, PLN2, and PLN3. The number of planes PLN is not limited to four. The number of planes PLN may be one, or may be a plurality of planes other than four. The planes PLN0 to PLN3 can operate independently of each other. The planes PLN0 to PLN3 can also operate in parallel.

Next, an internal configuration of the plane PLN will be described. In the following, a case where the planes PLN0 to PLN3 have the same configuration will be described. The configurations of the planes PLN may be different from each other. Hereinafter, when not limited to any of the planes PLN0 to PLN3, the planes will be referred to as planes PLN. The plane PLN includes the memory cell array 52, the row decoder 5110, the sense amplifier module 5111, the data register 5112, and the column decoder 5113.

The memory cell array 52 includes a plurality of blocks BLK. In the example of FIG. 2, the memory cell array 52 includes four blocks BLK0, BLK1, BLK2, and BLK3. The number of blocks BLK in the memory cell array 52 in a certain plane PLN is appropriately set.

The row decoder 5110 is a decoding circuit for the row address RA. The row decoder 5110 selects any block BLK in the memory cell array 52 based on a decoding result. The row decoder 5110 applies a voltage to wirings (word lines and select gate lines, that will be described below) of the selected block BLK in a row direction.

The sense amplifier module 5111 is a circuit for mainly reading signals corresponding to the data DAT. The sense amplifier module 5111 is connected to the memory cell array 52. During a read operation, the sense amplifier module 5111 reads a voltage corresponding to the data DAT from the memory cell array 52. The sense amplifier module 5111 amplifies the voltage read from the memory cell array 52.

The data register 5112 is a register that temporarily stores the data DAT. The data register 5112 is connected to the sense amplifier module 5111. The data register 5112 includes a plurality of latch circuits. Each latch circuit temporarily stores write data or read data.

The column decoder 5113 is a circuit for decoding the column address CA. The column decoder 5113 receives the column address CA from the address register 5103. The column decoder 5113 selects a latch circuit in the data register 5112 based on a decoding result of the column address CA.

Next, a configuration example of a block will be described. FIG. 3 is a diagram showing a configuration example of each of a plurality of blocks in the memory cell array 52 of the NAND memory 5 according to the embodiment. In FIG. 3, a configuration of a block will be described focusing on the block BLK0. The other blocks also have the same configuration as the block BLK0. The block BLK0 includes four string units (SU0, SU1, SU2, and SU3). The four string units (SU0, SU1, SU2, and SU3) are disposed in a direction (horizontal direction) perpendicular to a direction in which a plurality of word lines WL0 to WL7 are stacked (vertical direction). Each string unit SU includes a plurality of strings NS. One end of each string NS is connected to a corresponding bit line among a plurality of bit lines (BL0 to BLn). The strings NS extend in the vertical direction. Control gates (may be referred to as gates) of a plurality of memory cell transistors in each string NS are respectively connected to the plurality of word lines (WL0, WL1, . . . , WL7).

Figure 4:
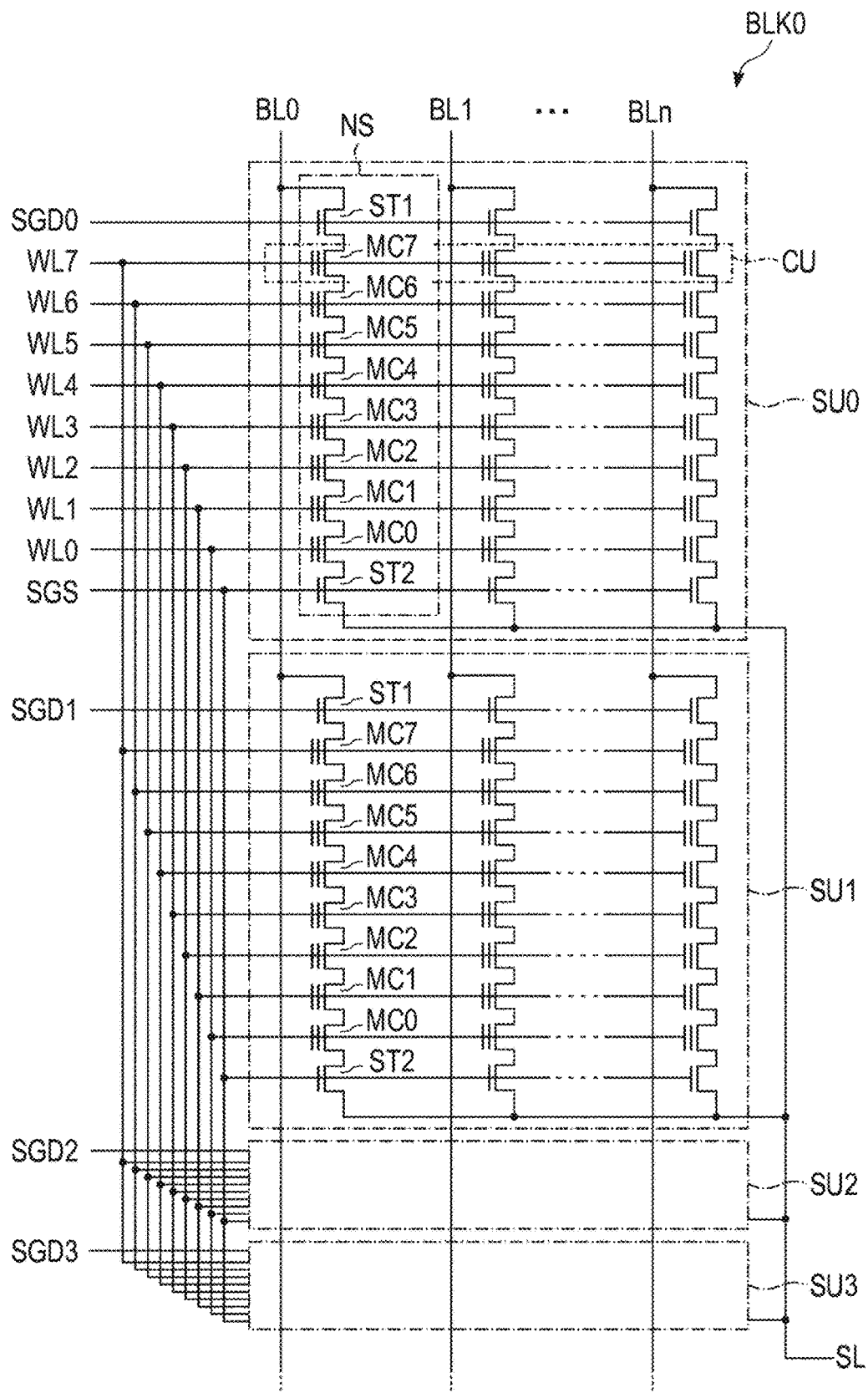
FIG. 4 is a diagram showing an example of a circuit configuration of each of the plurality of blocks in the memory cell array of the semiconductor memory device.

Next, a circuit configuration of the block will be described. FIG. 4 is a diagram showing an example of a circuit configuration of a block of the NAND memory 5 in the memory system 3 according to the embodiment. FIG. 4 shows a configuration example of the block shown in FIG. 3 in a planar manner.

In FIG. 4, the circuit configuration of the block will be described focusing on the block BLK0. The block BLK0 includes, for example, the four string units SU0 to SU3. The number of string units SU in each block BLK is appropriately set.

The string unit SU is, for example, a set of the plurality of strings NS that are selected at once in a program operation or a read operation. Each string unit SU includes the plurality of strings NS.

Each string NS is a set of a plurality of memory cells MC connected in series. The plurality of strings NS in the string unit SU are connected to any of the bit lines BL0 to BLn (n is an integer of 1 or more). The string NS includes a plurality of memory cells MC and select transistors ST1 and ST2. In the example of FIG. 4, the string NS includes eight memory cells MC0 to MC7 and the two select transistors ST1 and ST2. The number of memory cells MC in the string NS is not limited to eight.

The memory cell MC is a memory element that stores data in a non-volatile manner. The memory cell MC includes a control gate and a charge storage layer. The memory cell MC may be of a metal-oxide-nitride-oxide-silicon (MONOS) type or may be of a floating gate (FG) type. In the MONOS type, an insulating layer is used for the charge storage layer. In the FG type, a conductor layer is used for the charge storage layer.

The select transistors ST1 and ST2 are switching elements. The select transistors ST1 and ST2 are respectively used to select the string units SU during various operations.

A gate of each select transistor ST1 of the string unit SU0 is connected to a select gate line SGD0 corresponding to the string unit SU0. A gate of each select transistor ST1 of the string unit SU1 is connected to a select gate line SGD1 corresponding to the string unit SU1. A gate of each select transistor ST1 of the string unit SU2 is connected to a select gate line SGD2 corresponding to the string unit SU2. A gate of each select transistor ST1 of the string unit SU3 is connected to a select gate line SGD3 corresponding to the string unit SU3. On the other hand, gates of the select transistors ST2 of the string units SU0 to SU3 are connected to a select gate line SGS in common. The gates of the select transistors ST2 of the string units SU0 to SU3 may be connected to different select gate lines for each string unit. The control gates of the memory cells MC0 to MC7 in the same block BLK are connected to the word lines WL0 to WL7 in common, respectively.

A program operation and a read operation performed by the peripheral circuit 51 may be executed at once on a plurality of memory cells MC connected to one word line in one string unit SU. A set of memory cells MC selected at once during the program operation and the read operation is referred to as a memory cell group MG. The memory cell group MG is a unit of program operations and read operations, and is treated as a storage location. When each memory cell MC is configured to store 1-bit data (SLC mode), the size of data stored in each memory cell group MG is referred to as a page. When each memory cell MC is configured to store 4-bit data (QLC mode), the size of data stored in each memory cell group MG is 4 pages.

Figure 5:
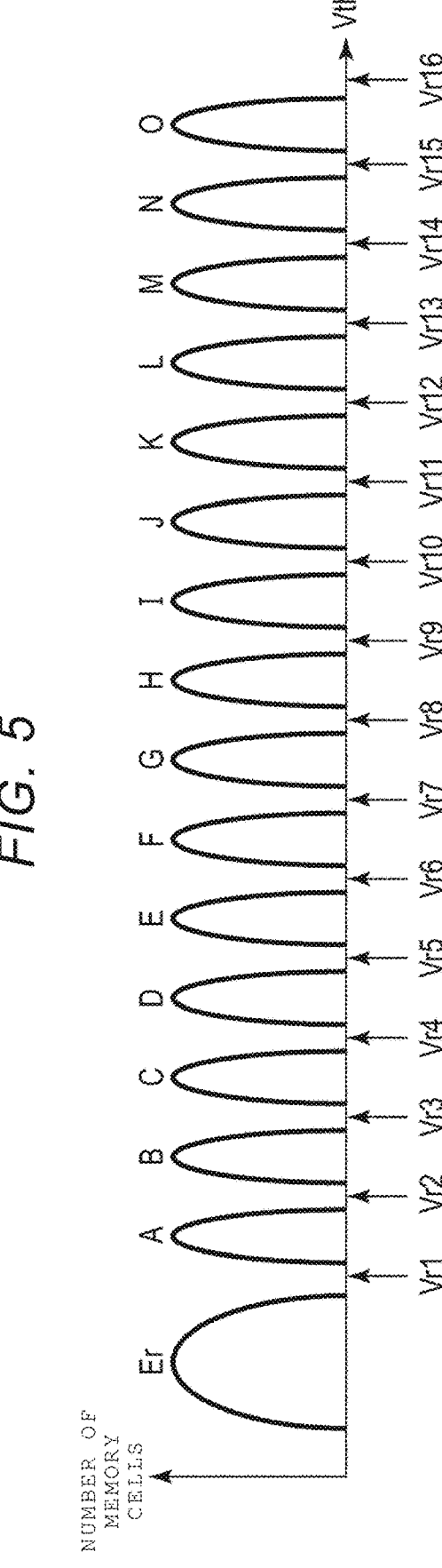
FIG. 5 is a diagram showing an example of a threshold voltage distribution of a plurality of memory cells in the semiconductor memory device.

Next, a threshold voltage distribution of a plurality of memory cells configured to store 4-bit data for each memory cell will be described. Here, it is assumed that data is written to each of a plurality of blocks in the NAND memory 5 in the QLC mode. FIG. 5 is a diagram showing an example of a threshold voltage distribution of a plurality of memory cells in the NAND memory 5 according to the embodiment.

A threshold voltage Vth of each memory cell changes depending on the amount of charge stored in a charge storage layer of each memory cell. Each of 16 types of 4-bit data that can be stored in each memory cell in the NAND memory 5 corresponds to each of 16 threshold voltage ranges represented by the threshold voltage Vth of the memory cell. Thereby, each memory cell stores data corresponding to a threshold voltage range to which the threshold voltage Vth of the memory cell belongs.

In the QLC mode, a threshold voltage that can be taken by each memory cell is divided into 16 threshold voltage ranges. In FIG. 5, the 16 threshold voltage ranges are referred to as an Er state, an A state, a B state, a C state, . . . , an O state in ascending order of threshold voltage. The threshold voltage Vth of each memory cell is controlled such that the threshold voltage belongs to one of the threshold voltage ranges by a program operation and an erase operation.

The 16 states correspond to different pieces of 4-bit data, respectively. For example, a threshold voltage Vth of a memory cell in which 4-bit data corresponding to the A state is programmed is set to a threshold voltage range from Vr1 to Vr2. Similarly, a threshold voltage Vth of a memory cell in which 4-bit data corresponding to the B state is programmed is set to a threshold voltage range from Vr2 to Vr3. Similarly, a threshold voltage Vth of a memory cell in which 4-bit data corresponding to the O state is programmed is set to a threshold voltage range from Vr15 to Vr16. The same applies to other states.

Here, the case where 4-bit data is written to each memory cell (QLC mode) is described, but data written to one memory cell may be one bit of data (SLC mode), two bits of data (MLC mode), three bits of data (TLC mode), or five bits or more of data.

In the SLC mode, a threshold voltage that can be taken by each memory cell is divided into two threshold voltage ranges. In the MLC mode, a threshold voltage is divided into four threshold voltage ranges. In the TLC mode, a threshold voltage is divided into eight threshold voltage ranges.

Next, an erase operation will be described.

First, a decrease in a threshold voltage Vth of a memory cell due to an erase operation will be described.

In the erase operation, charge is removed from the charge storage layer by applying an erase voltage Ver to a memory cell to which data is written (that is, a memory cell in which a program operation was performed). In the memory cell to which the program voltage Vpg is applied by the program operation, the amount of charge stored in the charge storage layer is increased. Thereby, the threshold voltage Vth of the memory cell to which data is written has a value greater than a threshold voltage range in an erased state, and belongs to a threshold voltage range corresponding to other states. A threshold voltage Vth of an erased memory cell is reduced to the threshold voltage range in the erased state due to a decrease in the amount of charge stored in the charge storage layer.

Figure 6:
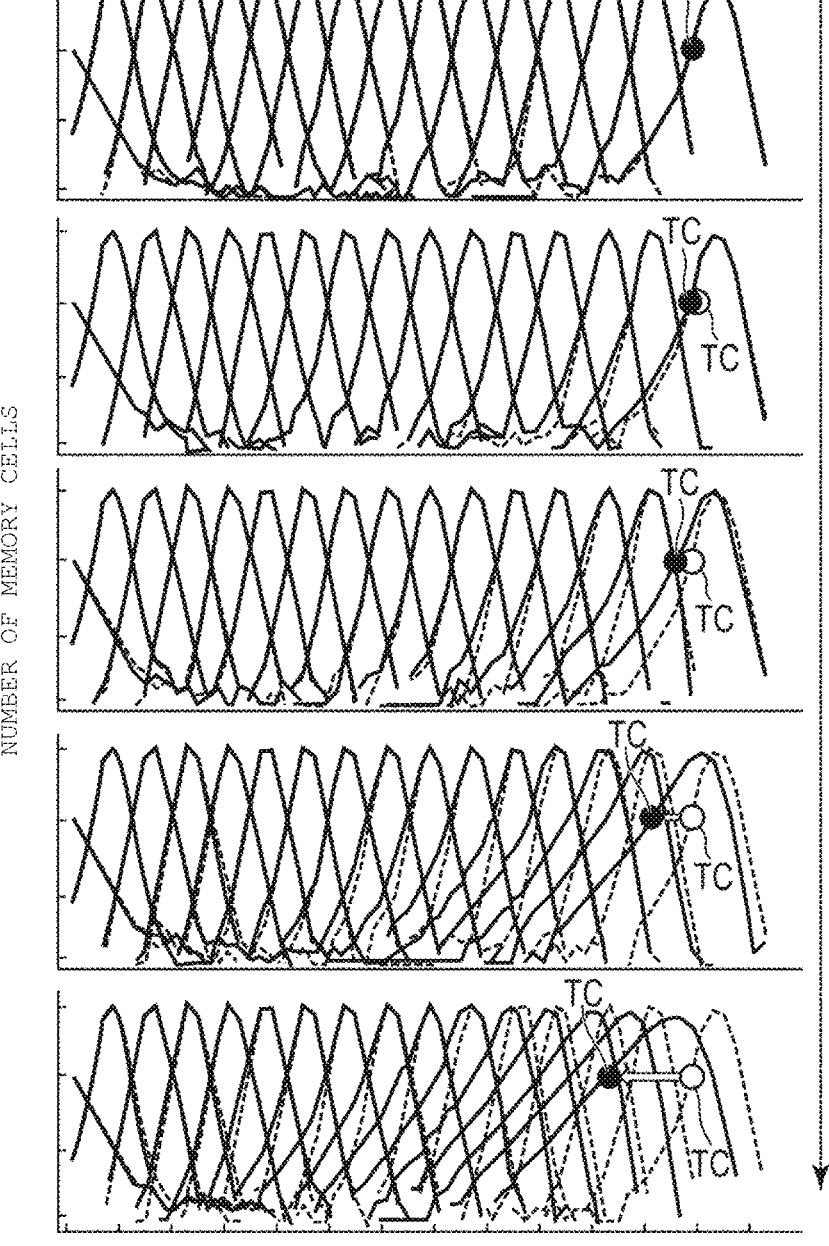
FIG. 6 is a diagram showing an example of a relationship between the threshold voltage distribution of the plurality of memory cells in the semiconductor memory device and an erase voltage.

Here, the amount of decrease in the threshold voltage Vth of the memory cell due to the erase operation is determined depending on the magnitude of an erase voltage Ver used in the erase operation, the length of a period of time during which the erase voltage Ver is applied, and the number of times the erase voltage Ver is applied. FIG. 6 is a diagram showing an example of a relationship between a threshold voltage distribution of a plurality of memory cells in the NAND memory 5 and the erase voltage Ver according to the embodiment.

FIG. 6 shows five graphs. A horizontal axis in each graph represents a threshold voltage Vth of each of a plurality of memory cells. A vertical axis in each graph represents the number of memory cells. A graph indicated by a dashed line shows a relationship between a threshold voltage Vth of each memory cell and the number of memory cells before the erase voltage Ver is applied. A graph indicated by a solid line shows a relationship between a threshold voltage Vth of each memory cell and the number of memory cells after the erase voltage Ver is applied.

In each graph, a plurality of threshold voltage ranges correspond to an O state, an N state, . . . , and an Er state in order from a threshold voltage range having a peak corresponding to a greater threshold voltage.

A graph at the uppermost stage among the five graphs shows a case where the erase voltage Ver is the smallest, a period of time during which the erase voltage Ver is applied is the shortest, and the number of times the erase voltage Ver is applied is the smallest. Here, the amount of change in the threshold voltage Vth of each of the plurality of memory cells before and after the erase operation is performed is the smallest. For example, when focusing on a specific memory cell (target cell TC) that belongs to the O state before the erase operation is executed, the target cell TC remains in the O state even after the erase operation is executed.

As the graph gets closer to the lower stage from the uppermost graph, the erase voltage Ver becomes larger, a period of time during which the erase voltage Ver is applied becomes longer, or the number of times the erase voltage Ver is applied becomes larger. Therefore, the amount of change in the threshold voltage Vth of each of the plurality of memory cells before and after the erase operation becomes larger as the graph gets closer to the lower stage. For example, in the second graph from the top, the target cell TC remains in the O state before and after the erase operation, but in the fourth graph from the top, the target cell TC transitions from the O state to the N state after the erase operation.

A graph at the lowermost stage among the five graphs shows a case where the erase voltage Ver is the largest, the time for which the erase voltage Ver is applied is the longest, and the number of times the erase voltage Ver is applied is the largest. Here, before and after the erase operation is executed, a threshold voltage distribution of the plurality of memory cells shifts significantly in a direction in which the threshold voltage Vth becomes smaller. For example, when focusing on the target cell TC that is in the O state before the erase operation is executed, the target cell TC has a threshold voltage Vth that belongs to the M state after the erase operation is executed.

Accordingly, the peripheral circuit 51 can control the amount of decrease in the threshold voltage Vth before and after the erase operation by varying parameters of the erase operation. The parameters include the value of the erase voltage Ver, the period of time during which the erase voltage Ver is applied, or the number of times the erase voltage Ver is applied.

For example, the peripheral circuit 51 can increase the amount of decrease in the threshold voltage Vth by setting the erase voltage Ver to a larger value. The peripheral circuit 51 can increase the amount of decrease in the threshold voltage Vth by increasing the period of time during which the erase voltage Ver is applied. The peripheral circuit 51 can increase the amount of decrease in the threshold voltage Vth by increasing the number of times the erase voltage Ver is applied.

Meanwhile, the peripheral circuit 51 can reduce the amount of decrease in the threshold voltage Vth by setting the erase voltage Ver to a smaller value. The peripheral circuit 51 can reduce the amount of decrease in the threshold voltage by shortening the period of time during which the erase voltage Ver is applied. The peripheral circuit 51 can reduce the amount of decrease in the threshold voltage by reducing the number of times the erase voltage Ver is applied.

Figure 7:
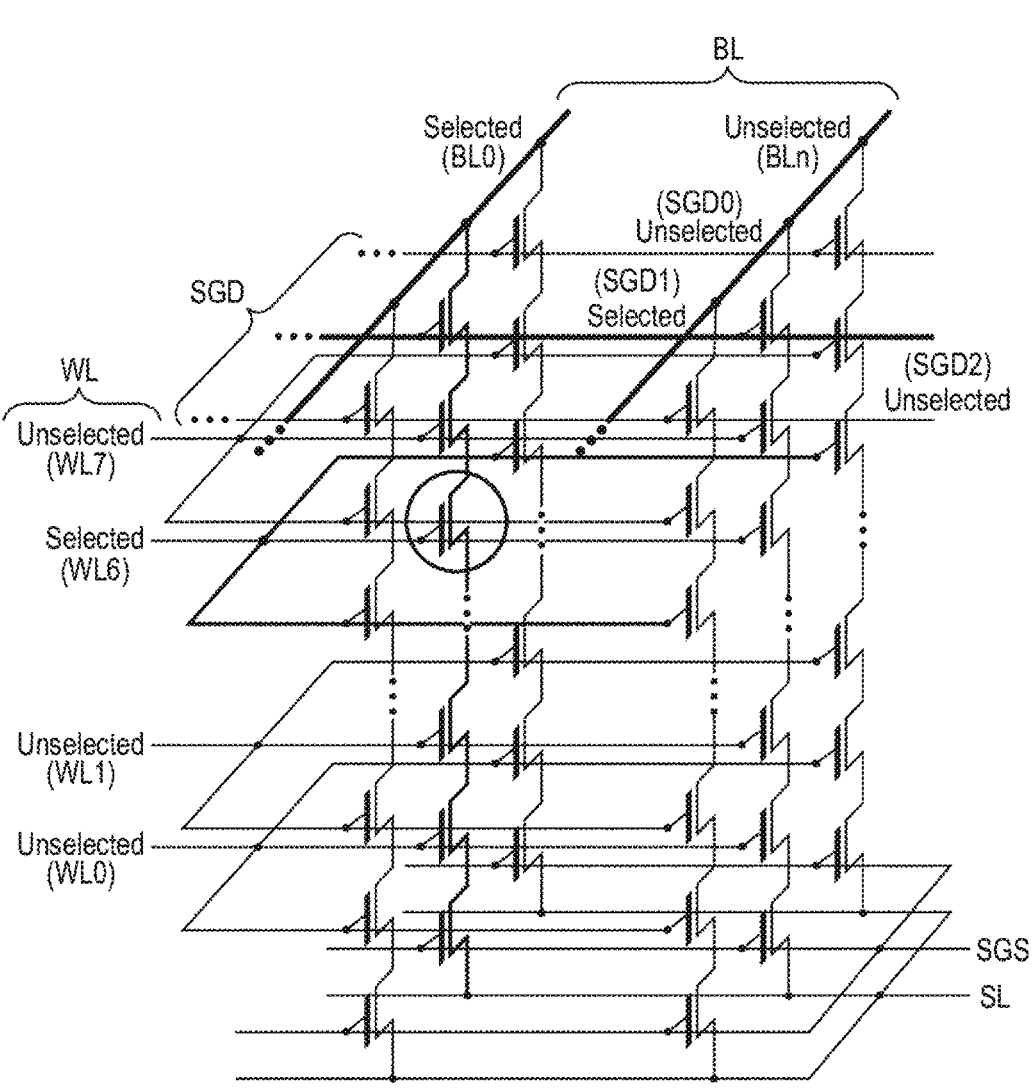
FIG. 7 is a diagram showing an example of one memory cell selected as a target of an erase operation in the semiconductor memory device.

Next, an erase operation for a specific memory cell will be described. FIG. 7 is a diagram showing an example of one memory cell selected as a target for an erase operation in the NAND memory 5 according to the embodiment.

The peripheral circuit 51 selects one select gate line SGD, one word line WL, and one bit line BL in a certain block. Thereby, the peripheral circuit 51 can select one memory cell, among a plurality of memory cells in the block, that is provided in the string unit SU corresponding to the selected select gate line SGD and is connected to the selected word line WL and the selected bit line BL. Then, the peripheral circuit 51 applies an erase voltage Ver only to the selected memory cell. Thereby, the peripheral circuit 51 can execute the erase operation only on a specific memory cell among the plurality of memory cells in the block.

Specifically, FIG. 7 shows a case where the peripheral circuit 51 selects the select gate line SGD1, the word line WL6, and the bit line BL0. The peripheral circuit 51 selects a memory cell MC that is connected to the word line WL6 and the bit line BL0 from among the plurality of memory cells MC in the string unit SU corresponding to the select gate line SGD1. Then, the peripheral circuit 51 applies the erase voltage Ver only to the selected memory cell to execute an erase operation.

Accordingly, the peripheral circuit 51 can select one specific memory cell from among a plurality of memory cells in a certain block, and execute an erase operation for only the selected one memory cell.

As described above, the peripheral circuit 51 can control the amount of decrease in the threshold voltage Vth of the memory cell by controlling the erase operation, and can execute the erase operation for only a specific memory cell in a certain block. Accordingly, the peripheral circuit 51 can select only the specific memory cell and execute the erase operation for adjusting the threshold voltage of the selected memory cell so that the threshold voltage is decreased.

Figure 8:
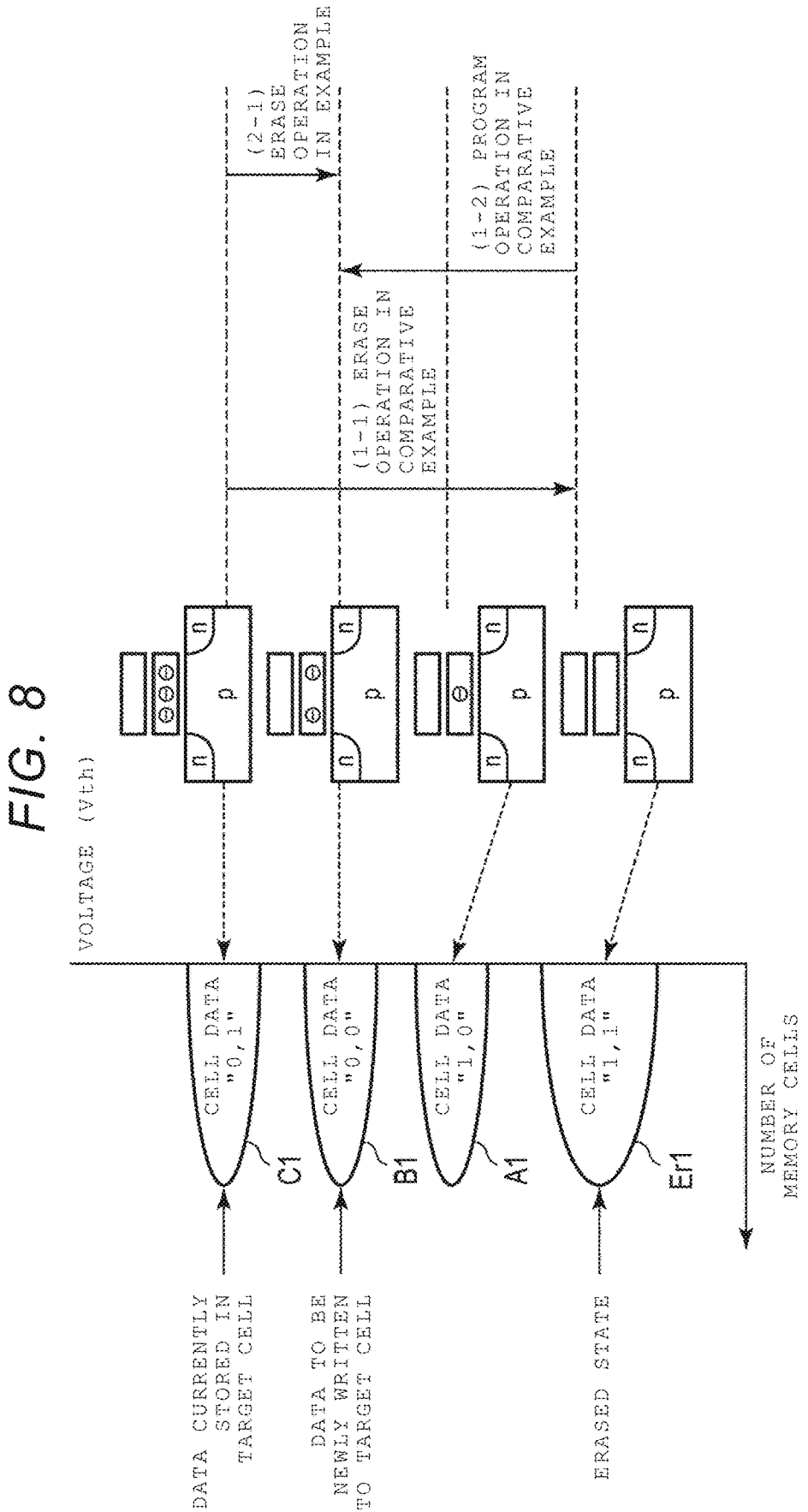
FIG. 8 is a diagram showing an example of a relationship between data in a write target memory cell and data to be written to the write target memory cell in each of the semiconductor memory device and a semiconductor memory device according to a comparative example.

Next, a write process using an erase operation will be described. FIG. 8 is a diagram showing an example of a relationship between data of a target cell and data to be written to the target cell in the NAND memory 5 according to the embodiment and a NAND memory according to a comparative example. In FIG. 8, it is assumed that data is written to each of a plurality of memory cells in the MLC mode.

Correspondence between a threshold voltage distribution of a plurality of memory cells and data stored in each memory cell (hereinafter also referred to as cell data) is shown on a left side in FIG. 8. Here, a threshold voltage range C1 with the highest peak threshold voltage corresponds to cell data (0, 1). A threshold voltage range B1 with the second highest peak threshold voltage corresponds to cell data (0, 0). A threshold voltage range A1 having the third highest peak threshold voltage corresponds to cell data (1, 0). A threshold voltage range Er1 with the lowest peak threshold voltage corresponds to cell data (1, 1) indicating the erased state.

In other words, the amount of charge stored in a charge storage layer of a memory cell that stores the cell data (0, 1) is larger than the amounts of charge stored in charge storage layers of memory cells that store the other pieces of cell data. The amount of charge stored in a charge storage layer of a memory cell that stores the cell data (0, 0) is smaller than the amount of charge stored in the charge storage layer of the memory cell that stores the cell data (0, 1) and is larger than the amount of charge stored in a charge storage layer of a memory cell that stores the cell data (1, 0) or the cell data (1, 1). The amount of charge stored in the charge storage layer of the memory cell that stores the cell data (1, 0) is smaller than the amount of charge stored in the charge storage layer of the memory cell that stores the cell data (0, 1) or the cell data (0, 0) and is larger than the amount of charge stored in the charge storage layer of the memory cell that stores the cell data (1, 1). The amount of charge stored in the charge storage layer of the memory cell that stores the cell data (1, 1) is smaller than the amounts of charge stored in the charge storage layers of the memory cells that store the other pieces of cell data.

Here, it is assumed that a write process is executed on a write target memory cell (may be referred to as a target cell) that is the memory cell in which the cell data (0, 1) is stored to newly write the cell data (0, 0) thereto.

First, a write process in the comparative example will be described. In the write process in the comparative example, when a new block including a target cell is selected as a write destination block, a peripheral circuit executes an erase operation for the write destination block ((1-1) in FIG. 8). The erase operation causes all memory cells in the write destination block to be turned into an erased state. In other words, all of the plurality of memory cells in the write destination block store the cell data (1, 1). Thereby, the cell data stored in the target cell changes from the cell data (0, 1) to the cell data (1, 1).

Next, a program operation is executed for a memory cell group including a target cell ((1-2) in FIG. 8). In the program operation, a program voltage Vpg is applied to each of a plurality of memory cells in the memory cell group via a word line. A threshold voltage Vth of the memory cell to which the program voltage Vpg is applied rises. Each time the peripheral circuit applies the program voltage Vpg, the peripheral circuit determines whether each of the threshold voltages Vth of the memory cells in the program target memory cell group belongs to a target threshold voltage range corresponding to each memory cell. Then, among the plurality of memory cells in the memory cell group, a memory cell having a threshold voltage Vth belonging to a target threshold voltage range corresponding to data to be written is set to be in a programming completion state (inhibit). An operation including determining whether each of the threshold voltages Vth of the memory cells belongs to the target threshold voltage range corresponding to each memory cell and setting each of the memory cells having a threshold voltage Vth belonging to the target threshold voltage range to be in the programming completion state is also referred to as a verification operation. Then, the peripheral circuit repeatedly executes the operation of applying a program voltage Vpg to memory cells that are not set to be in the programming completion state among the plurality of memory cells in the memory cell group, and the verification operation. Thereby, the threshold voltage Vth of the target cell in the program target memory cell group rises, the cell data stored in the target cell changes from the cell data (1, 1) to the cell data (0, 0), and the target cell is set to in the programming completion state.

As described above, in the write process in the comparative example, new data is written to the target cell via the erased state.

Next, a write process in the embodiment will be described. In the write process in the embodiment, when a new block including a target cell is selected as a write destination block, an erase operation is not executed for the entire write destination block. Therefore, the target cell in the write destination block is not necessarily turned into the erased state (a state in which the cell data (1, 1) is stored).

The peripheral circuit 51 determines whether the current threshold voltage Vth of the target cell is higher than a target threshold voltage Vref corresponding to data to be newly written to the target cell (cell data (0, 0)). Here, the current threshold voltage Vth of the target cell corresponds to the cell data (0, 1). Thereby, the peripheral circuit 51 determines whether the data stored in the target cell can be changed to the cell data (0, 0) by executing an erase operation for the target cell. Here, the target threshold voltage Vref corresponding to the cell data (0, 0) may be a first voltage Vref max indicating an upper limit of the threshold voltage range corresponding to the cell data (0, 0), or may be a third voltage Vref indicating one voltage that belongs to the threshold voltage range corresponding to the data (0, 0).

Here, since the threshold voltage Vth of the target cell is higher than the target threshold voltage Vref corresponding to the cell data (0, 0), the peripheral circuit 51 executes an erase operation for the target cell ((2-1) in FIG. 8). Through the erase operation, the peripheral circuit 51 reduces the threshold voltage Vth of the target cell so that the threshold voltage Vth belongs to the threshold voltage range corresponding to the cell data (0, 0). That is, the peripheral circuit 51 executes an erase operation so that the target cell stores the data to be written to the target cell. Here, the peripheral circuit 51 determines at least one of the magnitude of the erase voltage Ver, a period of time during which the erase voltage Ver is applied, and the number of times the erase voltage Ver is applied, that are used in the erase operation, based on the threshold voltage corresponding to the cell data (0, 1) and the threshold voltage corresponding to the cell data (0, 0).

Then, the peripheral circuit 51 reads data from the target cell and determines whether the read data matches the data to be written to the target cell. When the data read from the target cell matches the data to be written to the target cell, the peripheral circuit 51 completes writing to the target cell. The peripheral circuit 51 sets the target cell for which writing is completed to be in the programming completion state (inhibit). A program voltage or an erase voltage Ver is not applied to the target cell set to the programming completion state during a program operation for the other memory cells in the memory cell group including the target cell. Therefore, the target cell can maintain the data to be written.

As such, in the write process of the embodiment, new data is written to a target cell only by an erase operation without going through the erased state. Accordingly, in the write process of the embodiment, the amount of charge extracted from the charge storage layer of the target cell is a difference between the amount of charge stored in the charge storage layer of the memory cell in which the cell data (0, 1) is stored and the amount of charge stored in the charge storage layer of the memory cell in which the cell data (0, 0) is stored. On the other hand, in the write process of the comparative example, a target cell goes through the erased state once, and thus the amount of charge extracted from the charge storage layer of the target cell is a difference between the amount of charge stored in the charge storage layer of the memory cell in which the cell data (0, 1) is stored and the amount of charge stored in the charge storage layer of the memory cell in which the cell data (1, 1) is stored. In other words, in the write process of the embodiment, compared to the write process of the comparative example, the amount of charge extracted from the charge storage layer is reduced by a difference between the amount of charge stored in the charge storage layer of the memory cell in which the cell data (0, 0) is stored and the amount of charge stored in the charge storage layer of the memory cell in which the cell data (1, 1) is stored.

Here, the case where an erase operation is executed for a target cell so that the target cell stores data to be newly written (for example, cell data (0, 0)) is described, but the peripheral circuit 51 may execute an erase operation so that the target cell is set to be in a state other than the erased state and stores data (for example, cell data (1, 0)) corresponding to a threshold voltage range lower than a target threshold voltage range corresponding to data to be newly written. When such a rough erase operation is executed, here, the peripheral circuit 51 does not set the target cell to be in the programming completion state. Thereafter, the target cell is set to be in the programming completion state in response to a threshold voltage being raised to a state where the cell data (0, 0) is stored by a program operation performed on a memory cell group including the target cell.

Thus, in the write process of the embodiment, when new data is written to the target cell, it is possible to reduce the amount of charge extracted from the charge storage layer of the target cell. The memory cell deteriorates depending on the amount of charge extracted from the charge storage layer. Accordingly, it is possible to prevent deterioration of the memory cell from proceeding by the write process of the embodiment.

When the write process of the embodiment is executed, the peripheral circuit 51 compares a threshold voltage Vth of the target cell with a target threshold voltage Vref corresponding to new data to be written to the target cell. Here, the peripheral circuit 51 uses any one of a first method using a first voltage Vref max indicating an upper limit of the threshold voltage range corresponding to the new data and a second voltage Vref min indicating a lower limit of the threshold voltage range, or a second method using a third voltage Vref indicating one voltage determined based on new data.

First, a write process using the first method will be described.

Figure 9:
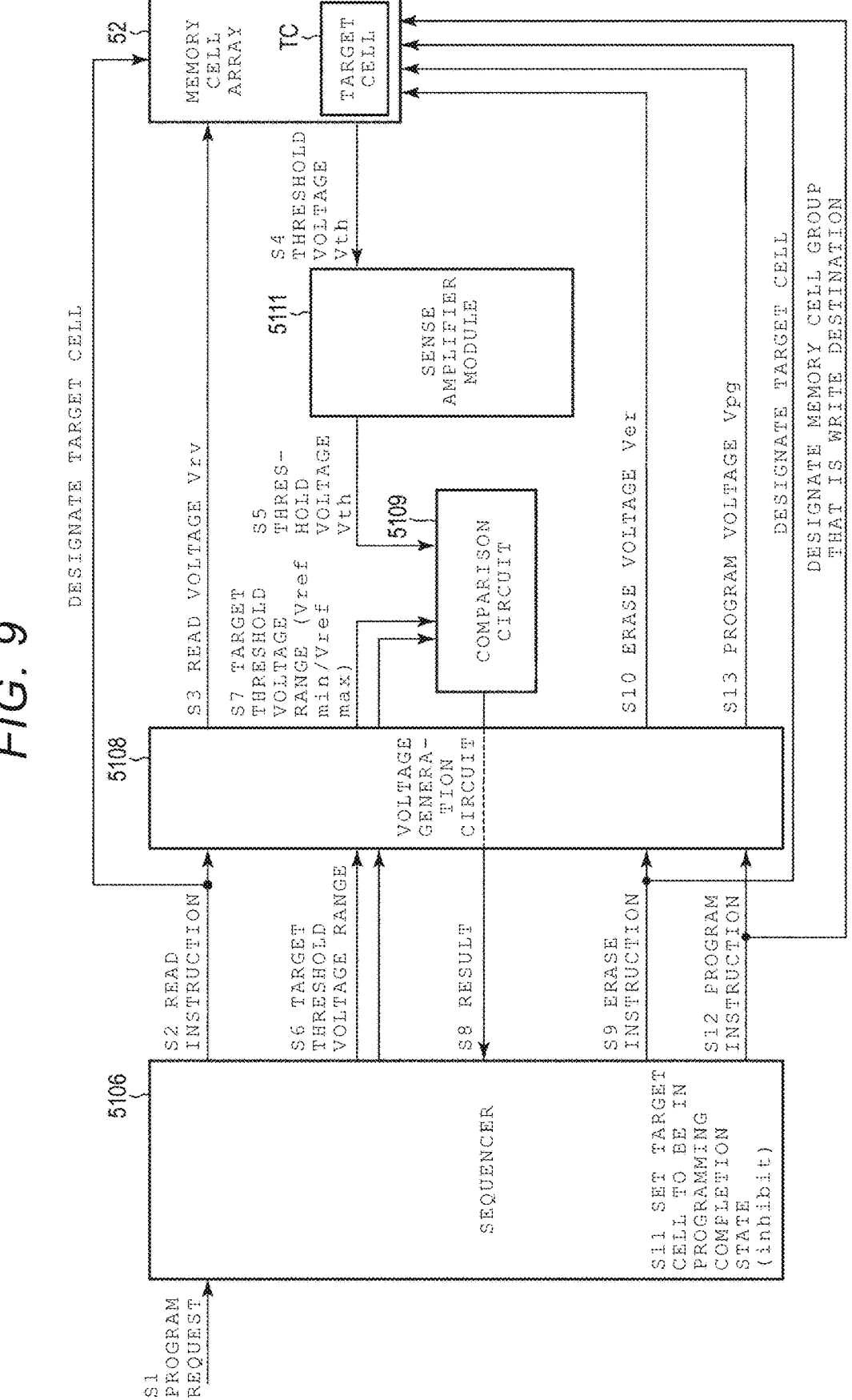
FIG. 9 is a block diagram showing a first example of a flow of a write process executed in the semiconductor memory device.

FIG. 9 is a block diagram showing a first example of a flow of a write process executed in the NAND memory 5 according to the embodiment. First, the controller 4 transmits a program request to the NAND memory 5 via the NAND interface 46 in response to a reception of a write command from the host 2. The controller 4 may transmit a program request to the NAND memory 5 spontaneously instead of in response to the write command received from the host 2. The program request includes information for designating a program target memory cell group. The program request is associated with data to be written to each memory cell in the program target memory cell group.

S1: The sequencer 5106 receives the program request from the NAND interface 46. The sequencer 5106 selects a target cell from a plurality of memory cells in the program target memory cell group designated by the program request.

S2: The sequencer 5106 transmits a read instruction to the voltage generation circuit 5108 to generate a read voltage Vrv for acquiring a threshold voltage Vth of the selected target cell. The sequencer 5106 designates the target cell TC in the memory cell array 52 by transmitting information for designating the selected target cell to the other elements of the peripheral circuit 51. The sequencer 5106 outputs, for example, information for designating a word line WL, a bit line BL, select gate lines SGD and SGS and a source line SL corresponding to the target cell TC, to which the target cell TC is connected.

S3: The voltage generation circuit 5108 generates the read voltage Vrv based on the received read instruction, and outputs the generated read voltage Vrv to the memory cell array 52.

S4: The memory cell array 52 controls a read operation for the target cell TC using the read voltage Vrv generated by the voltage generation circuit 5108. The sense amplifier module 5111 acquires the threshold voltage Vth of the target cell TC through the read operation. For example, when the read voltage Vrv is applied to the word line to which the memory cell group including the target cell TC is connected while a certain voltage value is applied to the bit line corresponding to the target cell TC, the sense amplifier module 5111 acquires the threshold voltage Vth.

S5: The sense amplifier module 5111 outputs the acquired threshold voltage Vth to the comparison circuit 5109.

S6: The sequencer 5106 instructs the voltage generation circuit 5108 to generate a first voltage Vref max indicating an upper limit of a target threshold voltage range that corresponds to data to be newly written to the target cell TC and a second voltage Vref min indicating a lower limit of the target threshold voltage range.

S7: The voltage generation circuit 5108 outputs, to the comparison circuit 5109, the first voltage Vref max and the second voltage Vref min generated based on the instruction given from the sequencer 5106. Here, the processes of S6 to S7 do not necessarily need to be executed after S5, and may be executed in parallel or independently of the processes of S2 to S5.

S8: The comparison circuit 5109 determines a magnitude relationship between the threshold voltage Vth input from the sense amplifier module 5111, and the first voltage Vref max and second voltage Vref min input from the voltage generation circuit 5108, and outputs a determination result to the sequencer 5106.

When the determination result output in S8 indicates that the threshold voltage Vth is higher than the first voltage Vref max, the peripheral circuit 51 executes the processes of S9 to S10.

S9: The sequencer 5106 transmits an erase instruction to the voltage generation circuit 5108 to generate an erase voltage Ver used in an erase operation for the target cell TC.

The erase instruction may include information for designating, for example, the magnitude of the erase voltage Ver, a period of time during which the erase voltage Ver is applied, or the number of times the erase voltage Ver is applied, that are determined based on a difference between the current threshold voltage Vth of the target cell TC and the target threshold voltage range. The sequencer 5106 designates the target cell TC in the memory cell array 52 by transmitting information for designating the selected target cell to the other elements of the peripheral circuit 51. The sequencer 5106 outputs, for example, information for designating a word line WL, a bit line BL, select gate lines SGD and SGS and a source line SL corresponding to the target cell TC, to which the target cell TC is connected.

S10: The voltage generation circuit 5108 outputs, to the memory cell array 52, the erase voltage Ver generated based on the received erase instruction. The memory cell array 52 controls an erase operation for the target cell TC using the erase voltage Ver generated by the voltage generation circuit 5108. For example, when the erase voltage Ver is applied to the word line to which the memory cell group including the target cell TC is connected while a certain voltage value is applied to the bit line corresponding to the target cell TC, the erase operation is controlled.

After S10 is completed, the peripheral circuit 51 may execute the processes of S2 to S8 again. Specifically, the peripheral circuit 51 repeatedly executes the erase operation until the threshold voltage Vth of the target cell TC becomes equal to or lower than the first voltage Vref max.

When the determination result output in S8 indicates that the threshold voltage Vth is equal to or lower than the first voltage Vref max and equal to or higher than the second voltage Vref min, the peripheral circuit 51 executes the process of S11.

S11: The sequencer 5106 sets the target cell TC to be in the programming completion state (inhibit). Thereby, when a program operation is executed for other memory cells in the memory cell group including the target cell TC, the program voltage Vpg is not applied to the target cell TC. Thereafter, the sequencer 5106 selects the next target cell TC from the program target memory cell group, and executes the process of S2 and the subsequent processes again.

When the comparison result output in S8 indicates that the threshold voltage Vth is lower than the second voltage Vref min, the peripheral circuit 51 performs nothing on the target cell TC. That is, the target cell TC is not set to be in the programming completion state (inhibit). The next target cell TC is selected from the program target memory cell group, and the process of S2 and the subsequent processes are executed again.

When each of the memory cells in the program target memory cell group is selected as the target cell TC, the peripheral circuit 51 executes the processes of S12 to S13 when the memory cells in the program target memory cell group include one or more memory cells that have a threshold voltage Vth being lower than the second voltage Vref min and do not store data. The one or more memory cells are memory cells that are not set to be in the programming completion (inhibit) state.

S12: The sequencer 5106 transmits a program instruction for generating a program voltage Vpg used in a program operation for a write destination memory cell group to the voltage generation circuit 5108. The sequencer 5106 designates a write destination memory cell group in the memory cell array 52 by transmitting information for designating the write destination memory cell group to the other elements of the peripheral circuit 51. The sequencer 5106 outputs, for example, information for designating a word line WL to which the write destination memory cell group is connected.

S13: The voltage generation circuit 5108 outputs, to the memory cell array 52, the program voltage Vpg generated based on the received program instruction. The memory cell array 52 controls a program operation for the write destination memory cell group using the program voltage Vpg generated by the voltage generation circuit 5108. For example, a program operation is controlled by applying the program voltage Vpg to the word line to which the program target memory cell group is connected while a certain voltage value is applied to each bit line corresponding to each memory cell that is not set to be in the programming completion state among the memory cells in the program target memory cell group. The target cell TC having a threshold voltage Vth being lower than the second voltage Vref min based on the comparison result output in S8 is included in targets for the program operation in S13.

Figure 10:
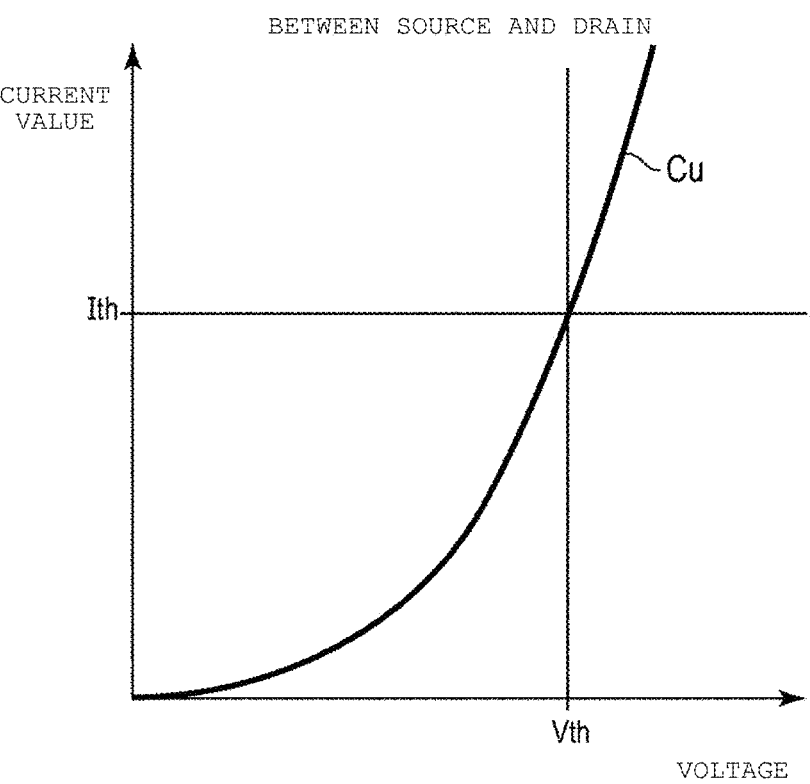
FIG. 10 is a diagram showing a relationship between a current value from a memory cell in the semiconductor memory device and a threshold voltage.

Next, a relationship between a current value output from a memory cell and a threshold voltage Vth of the memory cell will be described. For example, as in S4 of FIG. 9, when a read voltage Vrv is applied to the memory cell, the peripheral circuit 51 acquires a threshold voltage of the memory cell based on the current value output from the memory cell. FIG. 10 is a diagram showing a relationship between a current value from the memory cell in the NAND memory 5 and a threshold voltage according to the embodiment.

A vertical axis represents a current value of a current output from a memory cell to which a read voltage Vrv is applied. A horizontal axis represents a threshold voltage of the memory cell.

A curve Cu in FIG. 10 shows a relationship between a current value output from each memory cell and a threshold voltage of the memory cell. That is, it is possible to specify a threshold voltage of a certain memory cell based on a current value of a current output from the memory cell.

Specifically, the sense amplifier module 5111 acquires a current value Ith indicating the amount of current output from the memory cell by applying the read voltage Vrv to a word line of the memory cell and applying a certain voltage to a bit line of the memory cell. The peripheral circuit 51 can acquire a threshold voltage Vth based on the acquired current value Ith with reference to correspondence between the current value Ith and the threshold voltage Vth for the memory cell.

Accordingly, for the sake of simplicity, it will be described that the sense amplifier module 5111 acquires a threshold voltage Vth from a read target memory cell by a read operation.

Figure 11:
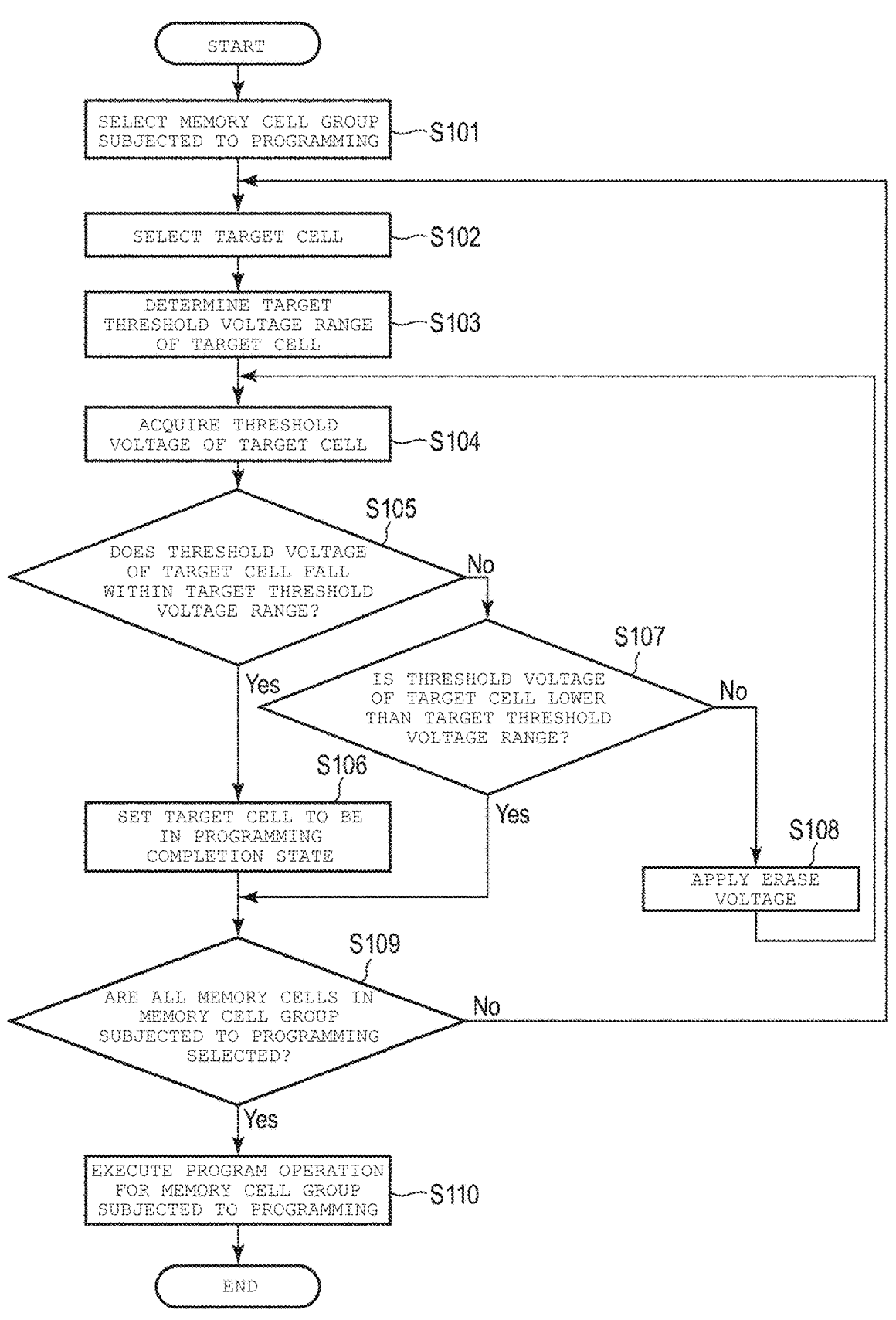
FIG. 11 is a flowchart showing a first example of a procedure of the write process executed in the semiconductor memory device.

Next, a procedure of the write process using the first method will be described. FIG. 11 is a flowchart showing a first example of the procedure of the write process executed in the NAND memory 5 according to the embodiment. The peripheral circuit 51 starts the write process in response to a reception of a program request from the controller 4.

The peripheral circuit 51 selects a program target memory cell group based on the received program request (S101).

The peripheral circuit 51 selects a write target memory cell (target cell) from among a plurality of memory cells in the memory cell group selected in S101 (S102).

The peripheral circuit 51 determines a target threshold voltage range of the target cell based on data associated with the program request (S103). The target threshold voltage range is a threshold voltage range corresponding to data to be newly written to the target cell. The peripheral circuit 51 determines, for example, a first voltage Vref max indicating an upper limit of the target threshold voltage range and a second voltage Vref min indicating a lower limit of the target threshold voltage range.

The peripheral circuit 51 applies a read voltage Vrv to the target cell to acquire the current threshold voltage Vth of the target cell (S104).

The peripheral circuit 51 determines whether the threshold voltage Vth of the target cell acquired in S104 falls within the target threshold voltage range determined in S103 (S105). That is, the peripheral circuit 51 determines whether the current threshold voltage Vth of the target cell acquired in S104 is equal to or lower than the first voltage Vref max and equal to or higher than the second voltage Vref min determined in S103.

When the threshold voltage Vth of the target cell acquired in S104 falls within the target threshold voltage range determined in S103 (Yes in S105), the peripheral circuit 51 sets the target cell to be in the programming completion state (inhibit) (S106).

When the threshold voltage Vth of the target cell acquired in S104 does not fall within the target threshold voltage range determined in S103 (No in S105), the peripheral circuit 51 determines whether the threshold voltage Vth of the target cell is lower than the target threshold voltage range (S107). Specifically, the peripheral circuit 51 determines whether the current threshold voltage Vth of the target cell acquired in S104 is lower than the second voltage Vref min or higher than the first voltage Vref max.

When the threshold voltage Vth of the target cell is higher than the target threshold voltage range, that is, when the current threshold voltage Vth of the target cell is higher than the first voltage Vref max (No in S107), the peripheral circuit 51 applies an erase voltage Ver to the target cell (S108). The peripheral circuit 51 may determine the magnitude of the erase voltage Ver to be applied based on a difference between the threshold voltage Vth of the target cell and the target threshold voltage range. The peripheral circuit 51 may determine not only the magnitude of the erase voltage Ver, but also a period of time during which the erase voltage Ver is applied and the number of times the erase voltage Ver is applied. Then, the process by the peripheral circuit 51 returns to S104 and the peripheral circuit 51 acquires the threshold voltage Vth of the target cell again and determines whether the threshold voltage Vth of the target cell falls within the target threshold voltage range.

After S106 or when the threshold voltage Vth of the target cell is lower than the target threshold voltage range (Yes in S107), the peripheral circuit 51 determines whether all of the memory cells in the program target memory cell group are selected as target cells (S109).

When there is a memory cell that is not yet selected among the memory cells in the program target memory cell group (No in S109), the process by the peripheral circuit 51 returns to S102 and the peripheral circuit 51 selects the next target cell from among the memory cells that are not yet selected as target cells among the plurality of memory cells in the program target memory cell group.

When all of the memory cells in the program target memory cell group are selected (Yes in S109), the peripheral circuit 51 executes a program operation for the program target memory cell group (S110).

As such, in the write process using the first method, the peripheral circuit 51 including the sequencer 5106, the voltage generation circuit 5108, the comparison circuit 5109, and the sense amplifier module 5111 controls a read operation, an erase operation, and a program operation for the target cell based on a magnitude relationship between the current threshold voltage Vth of the target cell and the target threshold voltage range determined based on the data to be written to the target cell. Then, the peripheral circuit 51 sets the memory cells whose threshold voltages Vth belong to the target threshold voltage range to be in the programming completion state.

Thereby, when the current threshold voltage Vth of the target cell is higher than the first voltage Vref max indicating the upper limit of the target threshold voltage range, the peripheral circuit 51 can set the target cell to be in the programming completion state without going through the erased state only by lowering the threshold voltage Vth by an erase operation. When the current threshold voltage Vth of the target cell is lower than the second voltage Vref min indicating the lower limit of the target threshold voltage range, the peripheral circuit 51 can set the target cell to be in the programming completion state without going through the erased state only by increasing the threshold voltage Vth by a program operation.

Next, a write process using the second method will be described. In the write process using the second method, the third voltage Vref indicating one voltage value determined based on data to be newly written to a write target memory cell is used as the target threshold voltage Vref. Here, the third voltage Vref is less than a value indicating an upper limit of a target threshold voltage range (first voltage Vref max) and larger than a value indicating a lower limit of the target threshold voltage range (second voltage Vref min). The peripheral circuit 51 sets the magnitude of a program voltage Vpg so that the amount of change in a threshold voltage Vth of the memory cell, that changes each time a program voltage Vpg is applied to the memory cell, becomes smaller than a difference between the third voltage Vref and the value indicating the upper limit of the target threshold voltage range and a difference between the third voltage Vref and the value indicating the lower limit of the target threshold voltage. The peripheral circuit 51 sets the magnitude of an erase voltage Ver so that the amount of change in a threshold voltage Vth of a write target memory cell, that changes each time an erase voltage Ver is applied to the memory cell, becomes smaller than a difference between the third voltage Vref and the value indicating the upper limit of the target threshold voltage range and a difference between the third voltage Vref and the value indicating the lower limit of the target threshold voltage range.

First, a program operation will be described. The peripheral circuit 51 executes a program operation for a program target memory cell group that is designated by a program request. The peripheral circuit 51 applies a program voltage Vpg to each memory cell that is not set to be in the programming completion state among a plurality of memory cells in the program target memory cell group. Here, the peripheral circuit 51 determines whether each of threshold voltages Vth of the memory cells in the program target memory cell group reaches a third voltage Vref corresponding to each memory cell every time the program voltage Vpg is applied to each of the memory cells that are not set to be in the programming completion state among the program target memory cell groups. Then, the peripheral circuit 51 sets each of the memory cells having a threshold voltage Vth reaching the third voltage Vref to be in the programming completion state. An operation including determining whether each of the threshold voltages Vth of the memory cells reaches the third voltage Vref corresponding to each memory cell and setting each of the memory cells having a threshold voltage Vth reaching the third voltage Vref to be in the programming completion state is also referred to as a verification operation. The peripheral circuit 51 sets each of the plurality of memory cells in the program target memory cell group to be in the programming completion state by repeatedly executing an operation of applying the program voltage Vpg and the verification operation.

Here, description will be given focusing on one memory cell (target cell) in the program target memory cell group. Each of FIGS. 12A to 12D is a diagram showing an example of a change in a threshold voltage due to a program operation executed in the NAND memory 5 according to the embodiment.

A vertical axis in each of FIGS. 12A to 12D represents a current value output from each memory cell to which a read voltage Vrv is applied. A horizontal axis represents a threshold voltage of each memory cell.

A target threshold voltage Vref indicates one voltage determined based on data to be written to the target cell (third voltage Vref). Here, the third voltage Vref is less than a value indicating an upper limit of a target threshold voltage range and larger than a value indicating a lower limit of the target threshold voltage range. The threshold voltage Vth indicates the value of the current threshold voltage of the target cell.

Figure 12A:
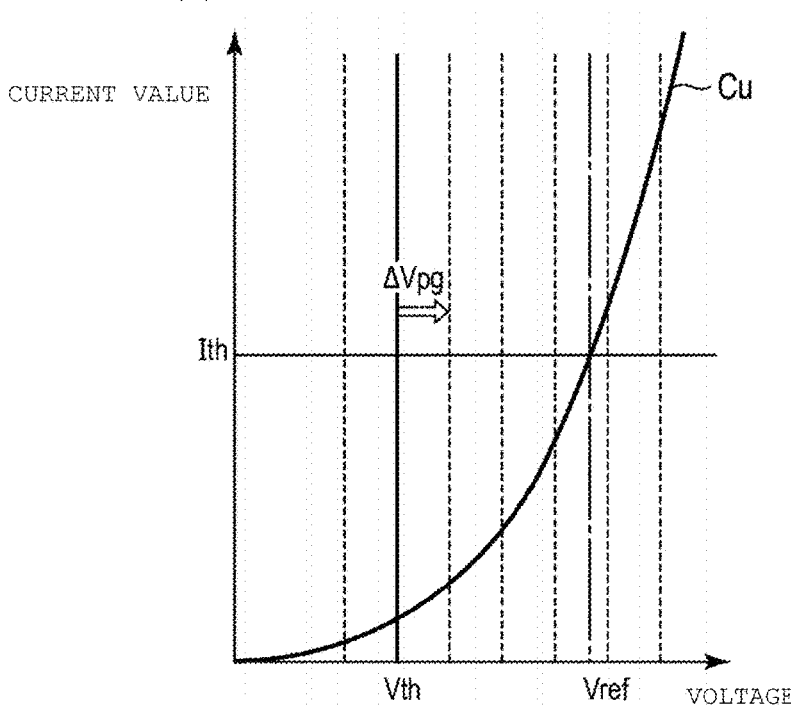
FIG. 12A is a diagram showing a first example of a change in a threshold voltage due to a program operation executed in the semiconductor memory device.

FIG. 12A shows the threshold voltage Vth of the target cell before the program voltage Vpg is applied and the amount of change ΔVpg in the threshold voltage Vth due to the application of the program voltage Vpg in a first program operation. For example, each time the program voltage Vpg is applied to each memory cell, the peripheral circuit 51 determines whether the threshold voltage Vth of each memory cell has become equal to or higher than the third voltage Vref. Since the threshold voltage Vth of the target cell after the first application of the program voltage Vpg is still lower than the third voltage Vref, the peripheral circuit 51 does not yet set the target cell to be in the programming completion state.

Figure 12B:
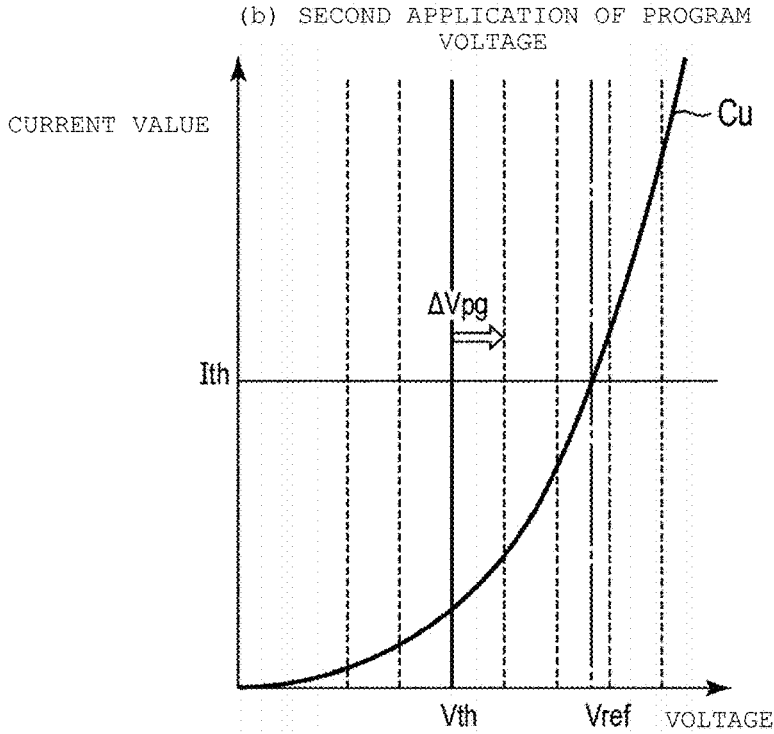
FIG. 12B is a diagram showing a second example of the change in the threshold voltage due to the program operation executed in the semiconductor memory device.
Figure 12C:
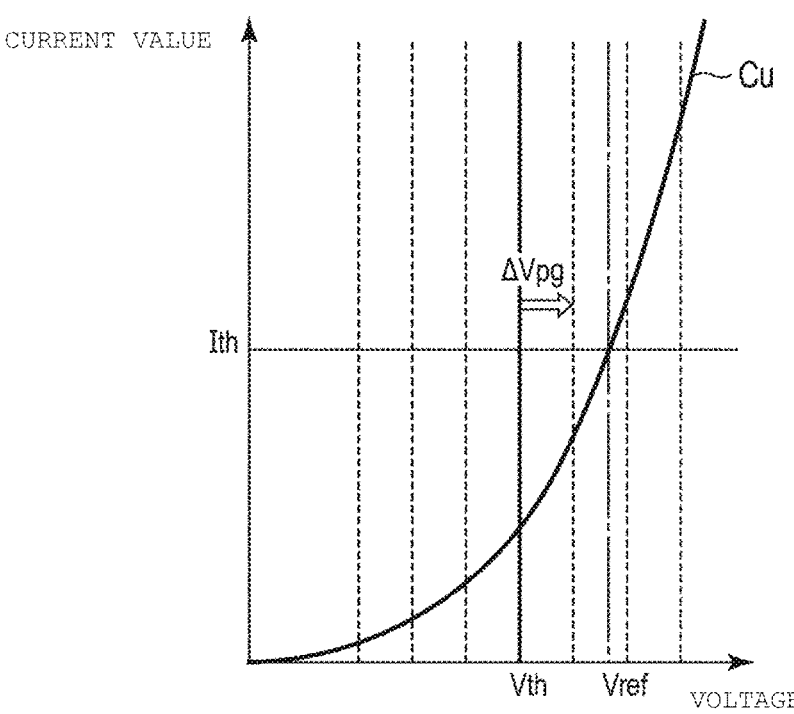
FIG. 12C is a diagram showing a third example of the change in the threshold voltage due to the program operation executed in the semiconductor memory device.

Each of FIGS. 12B and 12C shows the threshold voltage Vth of the target cell before the program voltage Vpg is applied and the amount of change ΔVpg in the threshold voltage due to the application of the program voltage Vpg in second and third program operations. After each of the program operations is performed, the peripheral circuit 51 determines whether the threshold voltage Vth of each of the memory cells becomes equal to or higher than the third voltage Vref. In either case after the second and third applications of the program voltage Vpg, the threshold voltage Vth of the target cell is lower than the third voltage Vref, and thus the peripheral circuit 51 does not set the target cell to be in the programming completion state.

Figure 12D:
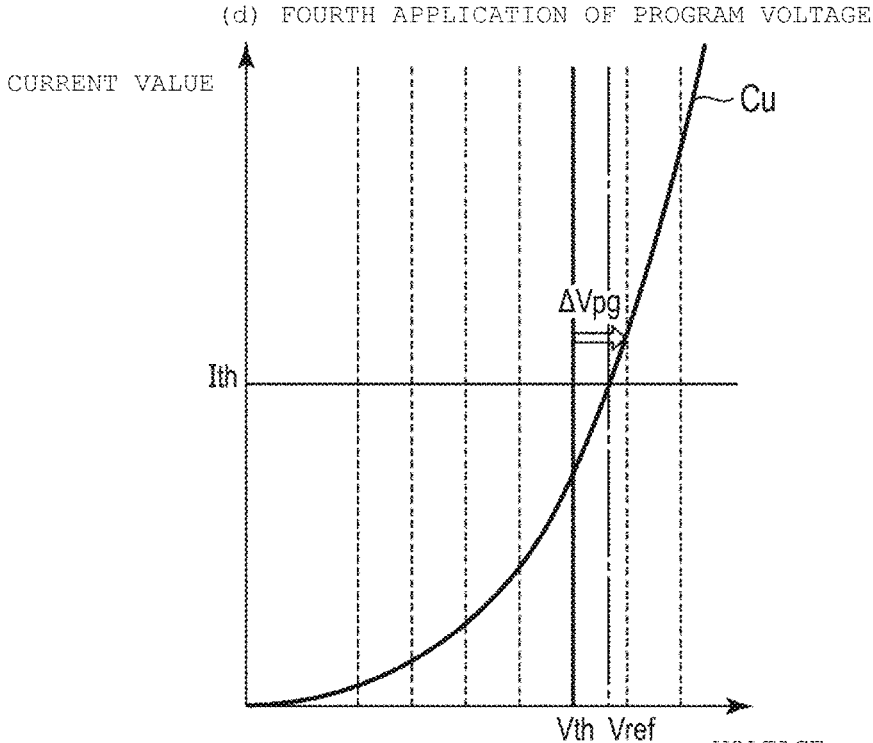
FIG. 12D is a diagram showing a fourth example of the change in the threshold voltage due to the program operation executed in the semiconductor memory device.

FIG. 12D shows the threshold voltage Vth of the target cell before the program voltage Vpg is applied and the amount of change ΔVpg in the threshold voltage Vth due to the application of the program voltage Vpg in a fourth program operation. By increasing the threshold voltage Vth by ΔVpg, the threshold voltage Vth of the target cell becomes a value larger than the third voltage Vref. Then, the peripheral circuit 51 sets the target cell to be in the programming completion state in response to the threshold voltage Vth of the target cell becoming the value higher than the third voltage Vref.

Here, ΔVpg is set to be smaller than a difference between the third voltage Vref and a first voltage Vref max and a difference between the third voltage Vref and a second voltage Vref min. Therefore, when the threshold voltage Vth does not reach the third voltage Vref in the third application of the program voltage Vpg, and the threshold voltage Vth reaches the third voltage Vref in the fourth application of the program voltage Vpg, the threshold voltage Vth of the target cell immediately after the fourth application of the program voltage Vpg is executed belongs to the target threshold voltage range. In other words, the target cell is storing data to be written.

Next, an erase operation will be described. The peripheral circuit 51 selects a write target memory cell from a program target memory cell group, and determines whether the threshold voltage Vth of the write target memory cell is higher than a target threshold voltage Vref of the write target memory cell. When the threshold voltage Vth of the write target memory cell is higher than the target threshold voltage Vref, the peripheral circuit 51 executes an erase operation for the selected write target memory cell. That is, the peripheral circuit 51 executes an erase operation in which an erase voltage Ver is applied only to the write target memory cell. In the write process using the second method, the peripheral circuit 51 determines whether the threshold voltage Vth of the write target memory cell is equal to or lower than the target threshold voltage Vref each time the erase voltage Ver is applied to the write target memory cell. Then, when the threshold voltage Vth is equal to or lower than the target threshold voltage Vref, the peripheral circuit 51 sets the write target memory cell to be in the programming completion state. The peripheral circuit 51 sets the write target memory cell to be in the programming completion state by repeatedly executing an operation of applying the erase voltage Ver to the write target memory cell and an operation of determining whether the threshold voltage Vth of the write target memory cell is equal to or lower than the target threshold voltage Vref.

Figure 13A:
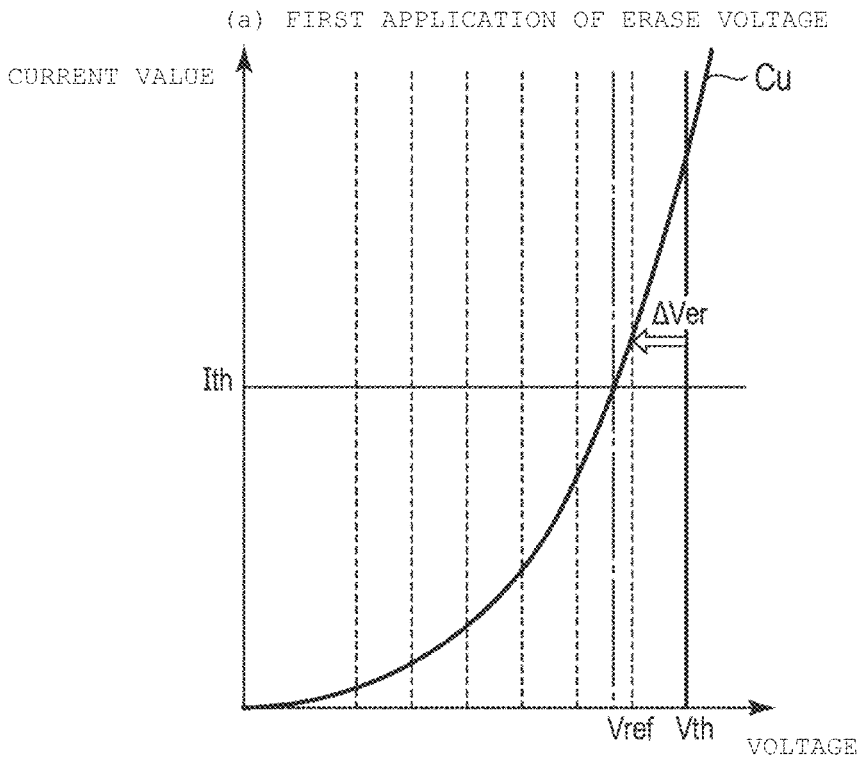
FIG. 13A is a diagram showing a first example of a change in a threshold voltage due to an erase operation performed in the semiconductor memory device.
Figure 13B:
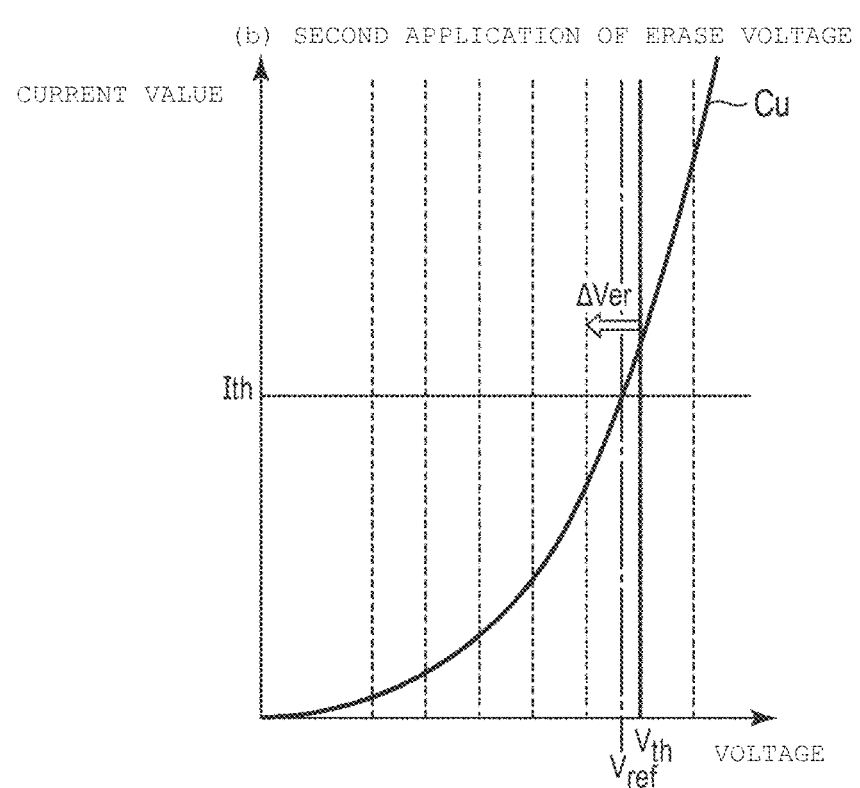
FIG. 13B is a diagram showing a second example of the change in the threshold voltage due to the erase operation performed in the semiconductor memory device.

Here, it is assumed that an erase operation is being executed for a certain write target memory cell. FIGS. 13A and 13B are diagrams showing an example of changes in a threshold voltage Vth due to the erase operation executed in the NAND memory 5 according to the embodiment.

A vertical axis in each of FIGS. 13A and 13B represents a current value output from each memory cell to which a read voltage Vrv is applied. A horizontal axis represents a threshold voltage Vth of each memory cell.

A target threshold voltage Vref indicates one voltage determined based on data to be written to a write target memory cell (third voltage). Here, the third voltage Vref is less than a value indicating an upper limit of a target threshold voltage range and larger than a value indicating a lower limit of the target threshold voltage range. The threshold voltage Vth indicates a value of the current threshold voltage of the write target memory cell.

FIG. 13A shows a threshold voltage Vth of a target cell before an erase voltage Ver is applied and the amount of change ΔVer in the threshold voltage due to the application of the erase voltage Ver in a first erase operation. For example, the peripheral circuit 51 determines whether the threshold voltage Vth of the target cell is equal to or lower than the third voltage Vref each time the erase voltage Ver is applied to the target cell. Since the threshold voltage Vth of the target cell after the first application of the erase voltage Ver is still higher than the third voltage Vref, the peripheral circuit 51 does not yet set the target cell to be in the programming completion state.

FIG. 13B shows the threshold voltage Vth of the target cell before the erase voltage Ver is applied and the amount of change ΔVer in the threshold voltage due to the application of the erase voltage Ver in a second erase operation. The threshold voltage Vth is decreased by ΔVer, and thus the threshold voltage Vth of the target cell becomes lower than the third voltage Vref. Then, the peripheral circuit 51 sets the target cell to be in the programming completion state in response to the threshold voltage Vth of the target cell becoming lower than the third voltage Vref.

Here, ΔVer is set to be smaller than a difference between the third voltage Vref and a first voltage Vref max and a difference between the third voltage Vref and a second voltage Vref min. Therefore, when the threshold voltage Vth does not reach the third voltage Vref in the first application of the erase voltage Ver and the threshold voltage Vth falls below the third voltage Vref in the second application of the erase voltage Ver, the threshold voltage Vth of the target cell immediately after the second application of the erase voltage Ver is executed belongs to the target threshold voltage range. In other words, the target cell is storing data to be written.

Figure 14:
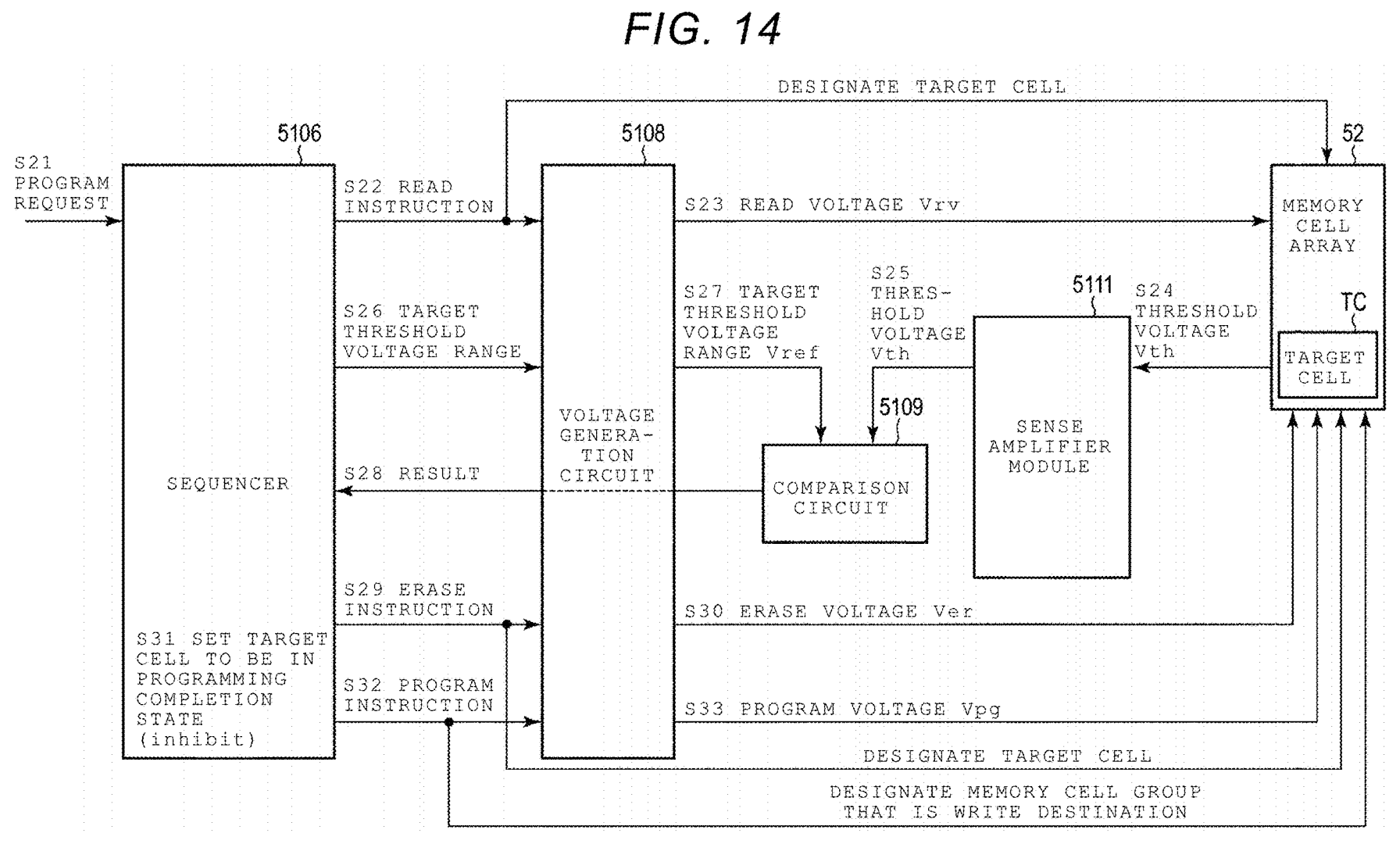

FIG. 14 is a block diagram showing a second example of a flow of a write process executed in the NAND memory 5 according to the embodiment. First, the controller 4 transmits a program request to the NAND memory 5 via the NAND interface 46 in response to the reception of a write command from the host 2. The controller 4 may transmit a program request to the NAND memory 5 spontaneously instead of in response to the write command received from the host 2.

In S21 to S25, the peripheral circuit 51 executes the same processes as the processes of S1 to S5 described with reference to FIG. 9.

S26: The sequencer 5106 instructs the voltage generation circuit 5108 to generate a target threshold voltage Vref (for example, third voltage Vref) corresponding to data to be newly written to a target cell TC. The target threshold voltage Vref is, for example, a median value of a target threshold voltage range.

S27: The voltage generation circuit 5108 outputs, to the comparison circuit 5109, the target threshold voltage Vref generated based on the instruction given from the sequencer 5106. Here, the processes of S26 to S27 do not necessarily need to be executed after S25, and may be executed in parallel or independently of the processes of S22 to S25.

S28: The comparison circuit 5109 determines a magnitude relationship between the threshold voltage Vth input from the sense amplifier module 5111 and the target threshold voltage Vref, and outputs a determination result to the sequencer 5106.

When the determination result output in S28 indicates that the threshold voltage Vth is higher than the target threshold voltage Vref, the peripheral circuit 51 executes the processes of S29 to S30.

S29: The sequencer 5106 transmits an erase instruction to the voltage generation circuit 5108 to generate an erase voltage Ver used in an erase operation for the target cell TC. The erase instruction may include information for designating, for example, the magnitude of the erase voltage Ver, a period of time during which the erase voltage Ver is applied, or the number of times the erase voltage Ver is applied, that are determined in advance. The sequencer 5106 designates the target cell TC in the memory cell array 52 by transmitting information for designating the selected target cell to the other elements of the peripheral circuit 51. The sequencer 5106 outputs, for example, information for designating a word line WL, a bit line BL, select gate lines SGD and SGS and a source line SL corresponding to the target cell TC, to which the target cell TC is connected.

S30: The voltage generation circuit 5108 outputs the erase voltage Ver generated based on the received erase instruction to the memory cell array 52. The memory cell array 52 controls an erase operation for the target cell TC using the erase voltage Ver generated by the voltage generation circuit 5108. For example, when the erase voltage Ver is applied to the word line to which the memory cell group including the target cell TC is connected while a certain voltage value is applied to the bit line corresponding to the target cell TC, the erase operation is controlled.

After S30 is completed, the peripheral circuit 51 executes the processes of S22 to S28 again. Thereby, the peripheral circuit 51 repeatedly executes the erase operation until the threshold voltage Vth of the target cell TC becomes equal to or lower than the target threshold voltage Vref.

S31: When a determination result indicating that the threshold voltage Vth of the target cell TC is equal to or lower than the target threshold voltage Vref is received after S30, the sequencer 5106 sets the target cell TC to be in the programming completion state (inhibit). Thereby, when a program operation is executed for other memory cells in the memory cell group including the target cell TC, a program voltage Vpg is not applied to the target cell TC. Thereafter, the sequencer 5106 selects the next target cell TC from the program target memory cell group, and executes the process of S22 and the subsequent processes again.

When the determination result output in S28 for the first time after the target cell TC is selected indicates that the threshold voltage Vth is equal to or lower than the target threshold voltage Vref, the peripheral circuit 51 selects the next target cell TC from the program target memory cell group without performing anything on the current target cell TC, and executes the process of S22 and the subsequent processes again.

After each of the memory cells in the program target memory cell group is selected as the target cell TC, the peripheral circuit 51 executes the processes of S32 to S33. The processes of S32 to S33 are the same processes as the processes of S12 to S13 described with reference to FIG. 9.

Figure 15:
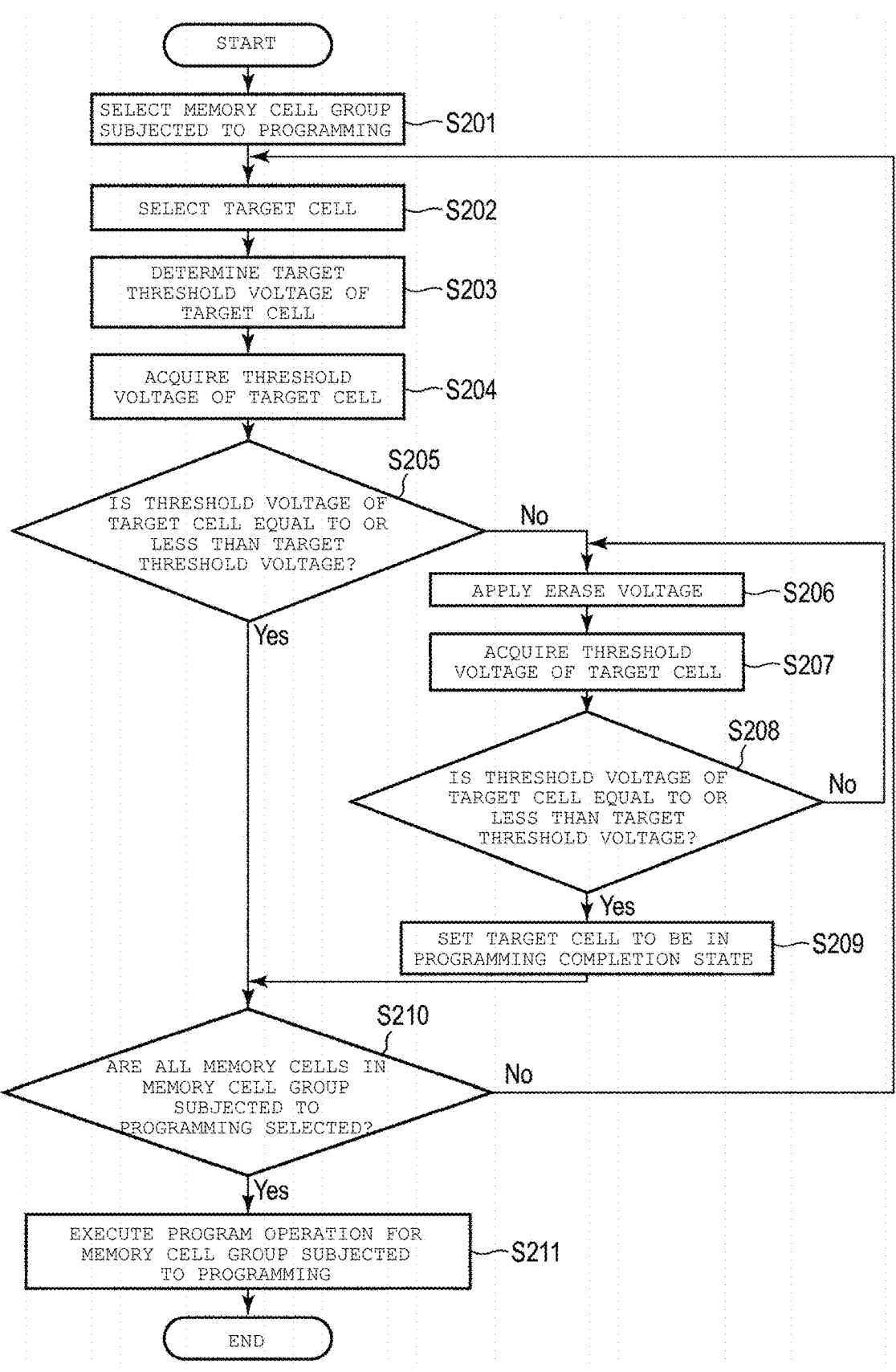
FIG. 15 is a flowchart showing a second example of a procedure of the write process executed in the semiconductor memory device.

Next, a procedure of a write process using the second method will be described. FIG. 15 is a flowchart showing a second example of the procedure of the write process executed in the NAND memory 5 according to the embodiment. The peripheral circuit 51 starts the write process in response to the reception of a program request from the controller 4.

The peripheral circuit 51 selects a program target memory cell group based on the received program request (S201). The peripheral circuit 51 selects a write target memory cell (target cell) from among a plurality of memory cells in the memory cell group selected in S201 (S202).

The peripheral circuit 51 determines a target threshold voltage Vref of the target cell based on data associated with the program request (S203). The target threshold voltage Vref is one voltage that belongs to a threshold voltage range corresponding to data to be newly written to the target cell (third voltage Vref). Here, the target threshold voltage Vref is less than a value indicating an upper limit of a target threshold voltage range and larger than a value indicating a lower limit of the target threshold voltage range. For example, the target threshold voltage Vref is a median value of the target threshold voltage range.

The peripheral circuit 51 executes a read operation for the target cell using a read voltage Vrv and acquires the current threshold voltage Vth of the target cell (S204).

The peripheral circuit 51 determines whether the threshold voltage Vth of the target cell acquired in S204 is equal to or lower than the target threshold voltage Vref determined in S203 (S205).

When the threshold voltage Vth of the target cell acquired in S204 is higher than the target threshold voltage Vref determined in S203 (No in S205), the peripheral circuit 51 applies an erase voltage Ver to the target cell (S206). The peripheral circuit 51 determines the magnitude of the erase voltage Ver to be applied so that the magnitude of the threshold voltage Vth that changes due to one application of the erase voltage Ver is smaller than a difference between the target threshold voltage Vref and the value indicating the upper limit of the target threshold voltage range, and a difference between the target threshold voltage Vref and the value indicating the lower limit of the target threshold voltage range. The peripheral circuit 51 may determine not only the magnitude of the erase voltage Ver, but also a period of time during which the erase voltage Ver is applied and the number of times the erase voltage Ver is applied.

The peripheral circuit 51 executes a read operation for the target cell using the read voltage Vrv, and acquires the current threshold voltage Vth of the target cell again (S207).

The peripheral circuit 51 determines whether the threshold voltage Vth of the target cell is equal to or lower than the target threshold voltage Vref (S208).

When the threshold voltage Vth of the target cell is still higher than the target threshold voltage Vref even after the erase voltage Ver is applied (No in S208), the process by the peripheral circuit 51 returns to S206 and the peripheral circuit 51 applies the erase voltage Ver to the target cell again.

When the threshold voltage Vth of the target cell becomes equal to or lower than the target threshold voltage Vref (Yes in S208), the peripheral circuit 51 sets the target cell to be in the programming completion state (inhibit) (S209).

When the threshold voltage Vth of the target cell is equal to or lower than the target threshold voltage Vref (Yes in S205), or after the process of S209 is completed, the peripheral circuit 51 determines whether all memory cells in the program target memory cell group are selected as target cells (S210).

When there is a memory cell that is not yet selected among the memory cells in the program target memory cell group (No in S210), the process by the peripheral circuit 51 returns to S202 and peripheral circuit 51 selects the next target cell from among the memory cells that are not yet selected as the target cells among the plurality of memory cells in the program target memory cell group.

When all of the memory cells in the program target memory cell group are selected (Yes in S210), the peripheral circuit 51 executes a program operation for the program target memory cell group (S211).

As such, in the write process using the second method, the peripheral circuit 51 including the sequencer 5106, the voltage generation circuit 5108, the comparison circuit 5109, and the sense amplifier module 5111 controls a read operation, an erase operation, and a program operation for the target cell based on a magnitude relationship between the current threshold voltage Vth of the target cell and the target threshold voltage Vref determined based on the data to be written to the target cell.

Thereby, as in the case using the first method, also in the write process using the second method, when the current threshold voltage Vth of the target cell is higher than the target threshold voltage Vref, the peripheral circuit 51 can set the target cell to be in the programming completion state without going through the erased state only by lowering the threshold voltage Vth by an erase operation. When the current threshold voltage Vth of the target cell is equal to or lower than the target threshold voltage Vref, the peripheral circuit 51 can set the target cell to be in the programming completion state without going through the erased state only by increasing the threshold voltage Vth by a program operation.

Next, description will be given of correspondence between a combination of the original state of a write target memory cell and a state after data is written and an operation executed for the write target memory cell in a write process. FIG. 16 is a diagram showing correspondence between a combination of the original state and a state after writing of a write target memory cell in the NAND memory 5 according to the embodiment and a write process. Here, it is assumed that the write process using the first method is executed. It is also assumed that data is written to a memory cell in the MLC mode.

For example, when the current threshold voltage Vth of a target cell falls within a target threshold voltage range, the peripheral circuit 51 does not execute a program operation and an erase operation in a write process. When the current threshold voltage Vth of the target cell is greater than a value indicating an upper limit of the target threshold voltage range, the peripheral circuit 51 only executes an erase operation for the target cell. When the current threshold voltage Vth of the target cell is less than a value indicating a lower limit of the target threshold voltage range, the peripheral circuit 51 only executes a program operation for the target cell. In other words, the peripheral circuit 51 controls an operation to be executed for the target cell in the write process based on a combination of data currently stored in the target cell (a state of the memory cell before the write process is executed) and data to be written to the target cell (a state of the memory cell after the write process is executed).

Hereinafter, a combination of the original state of the target cell and a state after writing of the target cell, and an operation executed for the target cell will be specifically illustrated.

As in the case shown in FIG. 8, a case is also shown in FIG. 16 in which the threshold voltage range with the highest peak threshold voltage corresponds to cell data (0, 1), the threshold voltage range with the second highest peak threshold voltage corresponds to cell data (0, 0), the threshold voltage range with the third highest peak threshold voltage corresponds to cell data (1, 0), and the threshold voltage range with the lowest peak threshold voltage corresponds to cell data (1, 1) indicating the erased state.

When the original state is a state where the cell data (1, 1) is stored and the state after writing is a state where the cell data (0, 1) is stored, the threshold voltage range corresponding to the cell data (1, 1) is lower than the threshold voltage range corresponding to the cell data (0, 1), and thus the peripheral circuit 51 executes only a program operation for the target cell.

When the original state is the state where the cell data (1, 1) is stored and the state after writing is a state where the cell data (0, 0) is stored, the threshold voltage range corresponding to the cell data (1, 1) is lower than the threshold voltage range corresponding to the cell data (0, 0), and thus the peripheral circuit 51 executes only a program operation for the target cell.

When the original state is the state where the cell data (1, 1) is stored and the state after writing is a state where the cell data (1, 0) is stored, the threshold voltage range corresponding to the cell data (1, 1) is lower than the threshold voltage range corresponding to the cell data (1, 0), and thus the peripheral circuit 51 executes only a program operation for the target cell.

When the original state is the state where the cell data (1, 1) is stored and the state after writing is the state where the cell data (1, 1) is stored, the peripheral circuit 51 executes neither a program operation nor an erase operation for the target cell.

When the original state is the state where the cell data (1, 0) is stored and the state after writing is the state where the cell data (0, 1) is stored, the threshold voltage range corresponding to the cell data (1, 0) is lower than the threshold voltage range corresponding to the cell data (0, 1), and thus the peripheral circuit 51 executes only a program operation for the target cell. Here, the peripheral circuit 51 can reduce the amount of charge extracted from the charge storage layer of the target cell, compared to a case where a program operation is executed after executing an erase operation until the target cell is set to be in the state where the cell data (1, 1) is stored (erased state).

When the original state is the state where the cell data (1, 0) is stored and the state after writing is the state where the cell data (0, 0) is stored, the threshold voltage range corresponding to the cell data (1, 0) is lower than the threshold voltage range corresponding to the cell data (0, 0), and thus the peripheral circuit 51 executes only a program operation for the target cell. Here, the peripheral circuit 51 can reduce the amount of charge extracted from the charge storage layer of the target cell, compared to the case where a program operation is executed after executing an erase operation until the target cell is set to be in the erased state.

When the original state is the state where the cell data (1, 0) is stored and the state after writing is the state where the cell data (1, 0) is stored, the peripheral circuit 51 executes neither a program operation nor an erase operation for the target cell. Here, the peripheral circuit 51 can reduce the amount of charge extracted from the charge storage layer of the target cell, compared to the case where a program operation is executed after executing an erase operation until the target cell is set to be in the erased state.

When the original state is the state where the cell data (1, 0) is stored and the state after writing is the state where the cell data (1, 1) is stored, the threshold voltage range corresponding to the cell data (1, 0) is higher than the threshold voltage range corresponding to the cell data (1, 1), and thus the peripheral circuit 51 executes only an erase operation for the target cell.

When the original state is the state where the cell data (0, 0) is stored and the state after writing is the state where the cell data (0, 1) is stored, the threshold voltage range corresponding to the cell data (0, 0) is lower than the threshold voltage range corresponding to the cell data (0, 1), and thus the peripheral circuit 51 executes only a program operation for the target cell. Here, the peripheral circuit 51 can reduce the amount of charge extracted from the charge storage layer of the target cell, compared to the case where a program operation is executed after executing an erase operation until the target cell is set to be in the erased state.

When the original state is the state where the cell data (0, 0) is stored and the state after writing is the state where the cell data (0, 0) is stored, the peripheral circuit 51 executes neither a program operation nor an erase operation for the target cell. Here, the peripheral circuit 51 can reduce the amount of charge extracted from the charge storage layer of the target cell, compared to the case where a program operation is executed after executing an erase operation until the target cell is set to be in the erased state.

When the original state is the state where the cell data (0, 0) is stored and the state after writing is the state where the cell data (1, 0) is stored, the threshold voltage range corresponding to the cell data (0, 0) is higher than the threshold voltage range corresponding to the cell data (1, 0), and thus the peripheral circuit 51 executes only an erase operation for the target cell. Here, the peripheral circuit 51 can reduce the amount of charge extracted from the charge storage layer of the target cell, compared to the case where a program operation is executed after executing an erase operation until the target cell is set to be in the erased state.

When the original state is the state where the cell data (0, 0) is stored and the state after writing is the state where the cell data (1, 1) is stored, the threshold voltage range corresponding to the cell data (0, 0) is higher than the threshold voltage range corresponding to the cell data (1, 1), and thus the peripheral circuit 51 executes only an erase operation for the target cell.

When the original state is the state where the cell data (0, 1) is stored and the state after writing is the state where the cell data (0, 1) is stored, the peripheral circuit 51 executes neither a program operation nor an erase operation for the target cell. Here, the peripheral circuit 51 can reduce the amount of charge extracted from the charge storage layer of the target cell, compared to the case where a program operation is executed after executing an erase operation until the target cell is set to be in the erased state.

When the original state is the state where the cell data (0, 1) is stored and the state after writing is the state where the cell data (0, 0) is stored, the threshold voltage range corresponding to the cell data (0, 1) is higher than the threshold voltage range corresponding to the cell data (0, 0), and thus the peripheral circuit 51 executes only an erase operation for the target cell. Here, the peripheral circuit 51 can reduce the amount of charge extracted from the charge storage layer of the target cell, compared to the case where a program operation is executed after executing an erase operation until the target cell is set to be in the erased state.

When the original state is the state where the cell data (0, 1) is stored and the state after writing is the state where the cell data (1, 0) is stored, the threshold voltage range corresponding to the cell data (0, 1) is higher than the threshold voltage range corresponding to the cell data (1, 0), and thus the peripheral circuit 51 executes only an erase operation for the target cell. Here, the peripheral circuit 51 can reduce the amount of charge extracted from the charge storage layer of the target cell, compared to the case where a program operation is executed after executing an erase operation until the target cell is set to be in the erased state.

When the original state is the state where the cell data (0, 1) is stored and the state after writing is the state where the cell data (1, 1) is stored, the threshold voltage range corresponding to the cell data (0, 1) is higher than the threshold voltage range corresponding to the cell data (1, 1), and thus the peripheral circuit 51 executes only an erase operation for the target cell.

As described above, in the NAND memory 5 according to the embodiment, the peripheral circuit 51 executes an erase operation for a target cell so that data to be written to the target cell is stored, when a threshold voltage Vth of the target cell is higher than a target threshold voltage Vref. Then, the peripheral circuit 51 sets the target cell to be in the programming completion state. Here, the amount of charge extracted from the charge storage layer of the target cell is smaller than when a program operation is executed after the target cell is once set to be in the erased state. Thereby, the peripheral circuit 51 can execute writing of the data for the target cell while preventing the memory cell from deteriorating.

When the peripheral circuit 51 receives a program request and information for designating a write process according to the embodiment, the peripheral circuit 51 may execute the write process using the first method or the second method. When the write process according to the embodiment is not designated by the controller 4 or when the write process according to the comparative example is designated by the controller 4, the peripheral circuit 51 may execute the write process according to the comparative example in which a program operation is executed for each page after executing an erase operation for setting each of memory cells in the entire write destination block to be in the erased state. As such, the peripheral circuit 51 can selectively execute the write process according to the embodiment and the write process according to the comparative example.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a plurality of memory cell transistors; and
a control circuit configured to set a threshold voltage of each of the memory cell transistors to be in one of a plurality of voltage ranges separate from each other to store multi-bit data in each of the memory cell transistors, the plurality of voltage ranges including a first voltage range corresponding to a first multi-bit value, a second voltage range that is lower than the first voltage range and corresponds to a second multi-bit value, and a third voltage range that is the lowest in the plurality of voltage ranges and corresponds to an erased state, wherein
when a target memory cell transistor in which data of the second multi-bit value is to be written currently stores data of the first multi-bit value, the control circuit is configured to apply a first voltage to a gate of the target memory cell transistor, to shift the threshold voltage of the target memory cell transistor to be in the second voltage range without dropping into the third voltage range.

2. The semiconductor memory device according to claim 1, wherein the control circuit includes a comparator circuit configured to compare a threshold voltage of the target memory cell transistor with a target voltage range corresponding to the second multi-bit value.

3. The semiconductor memory device according to claim 1, wherein the control circuit is further configured to vary a value of the first voltage based on a difference between a threshold voltage of the target memory cell transistor and a target voltage range corresponding to the second multi-bit value.

4. The semiconductor memory device according to claim 1, wherein the control circuit is further configured to vary an amount of time the first voltage is applied based on a difference between a threshold voltage of the target memory cell transistor and a target voltage range corresponding to the second multi-bit value.

5. The semiconductor memory device according to claim 1, wherein
the control circuit is further configured to repeatedly apply first voltages to the gate of the target memory cell transistor, to shift the threshold voltage of the target memory cell transistor to be in the second voltage range without dropping into the third voltage range.

6. The semiconductor memory device according to claim 5, wherein the control circuit is further configured to vary a number of times the first voltages are applied based on a difference between a threshold voltage of the target memory cell transistor and a target voltage range corresponding to the second multi-bit value.

7. The semiconductor memory device according to claim 1, wherein
when a second target memory cell transistor in which data of the first multi-bit value is to be written currently stores data of the second multi-bit value, the control circuit is further configured to apply a second voltage to the gate of the second target memory cell transistor, to shift the threshold voltage of the second target memory cell transistor to be in the first voltage range without dropping into the third voltage range.

8. The semiconductor memory device according to claim 7, wherein the control circuit is further configured to vary a value of the second voltage based on a difference between a threshold voltage of the second target memory cell transistor and a target voltage range corresponding to the first multi-bit value.

9. The semiconductor memory device according to claim 7, wherein the control circuit is further configured to vary an amount of time the second voltage is applied based on a difference between a threshold voltage of the second target memory cell transistor and a target voltage range corresponding to the first multi-bit value.

10. The semiconductor memory device according to claim 1, wherein
the control circuit is further configured to repeatedly apply second voltages to the gate of the second target memory cell transistor, to shift the threshold voltage of the second target memory cell transistor to be in the first voltage range without dropping into the third voltage range.

11. The semiconductor memory device according to claim 10, wherein the control circuit is further configured to vary a number of times the second voltages are applied based on a difference between a threshold voltage of the second target memory cell transistor and a target voltage range corresponding to the first multi-bit value.

12. The semiconductor memory device according to claim 1, wherein when a third target memory cell transistor in which data of the second multi-bit value is to be written currently stores the data of the second multi-bit value, the control circuit is further configured to apply neither any first voltage nor any second voltage to the gate of the third target memory cell transistor.

13. The semiconductor memory device according to claim 1, wherein
the plurality of voltage ranges includes a fourth voltage range that is lower than the second voltage range and higher than the third voltage range and corresponds to a third multi-bit value, and
when a fourth target memory cell transistor in which data of the third multi-bit value is to be written currently stores data of the first multi-bit value, the control circuit is further configured to apply a third voltage to a gate of the fourth target memory cell transistor, to shift the threshold voltage of the fourth target memory cell transistor to be in the fourth voltage range without dropping into the third voltage range.

14. The semiconductor memory device according to claim 1, wherein the plurality of voltage ranges includes a fifth voltage range that is higher than the first voltage range and corresponds to a fourth multi-bit value.

15. The semiconductor memory device according to claim 14, wherein the control circuit is further configured to perform a write operation with respect to a target group of memory cell transistors in response to a write request, with respect to a first sub group of memory cell transistors in the target group, that currently stores the data of the first multi-bit value and in which the data of the second multi-bit value is to be written, the control circuit is further configured to apply a fourth voltage to a gate of each memory cell transistor in the first sub group during the write operation, and with respect to a second sub group of memory cell transistors in the target group, that currently stores the data of the first multi-bit value and in which data of the fourth multi-bit value is to be written, the control circuit is further configured to apply a fifth voltage to a gate of each memory cell transistor in the second sub group during the write operation.

16. The semiconductor memory device according to claim 15, wherein with respect to a third sub group of memory cell transistors in the target group, that currently stores the data of the first multi-bit value and in which the data of the first multi-bit value is to be written, the control circuit is configured to apply neither any fourth voltage nor any fifth voltage to a gate of each memory cell transistor in the third sub group during the write operation.

17. A memory system comprising:

a memory chip comprising the semiconductor memory device according to claim 1; and a controller chip configured to control the memory chip.

18. A method for controlling a semiconductor memory device including a plurality of memory cell transistors, the method comprising:

setting a threshold voltage of each of the memory cell transistors to be in one of a plurality of voltage ranges separate from each other to store multi-bit data in each of the memory cell transistors, the plurality of voltage ranges including a first voltage range corresponding to a first multi-bit value, a second voltage range that is lower than the first voltage range and corresponds to a second multi-bit value, and a third voltage range that is the lowest in the plurality of voltage ranges and corresponds to an erased state; and when a target memory cell transistor in which data of the second multi-bit value is to be written currently stores data of the first multi-bit value, applying a first voltage to a gate of the target memory cell transistor, to shift the threshold voltage of the target memory cell transistor to be in the second voltage range without dropping into the third voltage range.

19. The method according to claim 18, further comprising:

varying a value of the first voltage or an amount of time the first voltage is applied based on a difference between a threshold voltage of the target memory cell transistor and a target voltage range corresponding to the second multi-bit value.

20. The method according to claim 18, further comprising:

repeatedly applying first voltages to the gate of the target memory cell transistor, to shift the threshold voltage of the target memory cell transistor to be in the second voltage range without dropping into the third voltage range; and varying a number of times the first voltages are applied based on a difference between a threshold voltage of the target memory cell transistor and a target voltage range corresponding to the second multi-bit value.

* * * * *